United States Patent
Wei et al.

(10) Patent No.: US 9,561,969 B2
(45) Date of Patent: Feb. 7, 2017

(54) INTRINSIC COMPLEX HALIDE ELPASOLITE SCINTILLATORS AND METHODS OF MAKING AND USING SAME

(71) Applicant: University of Tennessee Research Foundation, Knoxville, TN (US)

(72) Inventors: Hua Wei, Knoxville, TN (US); Luis Stand, Knoxville, TN (US); Mariya Zhuravleva, Knoxville, TN (US); Charles Melcher, Oak Ridge, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 0 days.

(21) Appl. No.: 14/688,879

(22) Filed: Apr. 16, 2015

(65) Prior Publication Data
US 2015/0301197 A1 Oct. 22, 2015

Related U.S. Application Data

(60) Provisional application No. 61/981,350, filed on Apr. 18, 2014.

(51) Int. Cl.
*G01T 1/202* (2006.01)
*C01D 17/00* (2006.01)
(Continued)

(52) U.S. Cl.
CPC ......... *C01D 17/003* (2013.01); *C09K 11/7705* (2013.01); *C09K 11/7773* (2013.01); *C30B 11/00* (2013.01); *C30B 29/12* (2013.01)

(58) Field of Classification Search
CPC .................................................. G01T 1/202
See application file for complete search history.

(56) References Cited

U.S. PATENT DOCUMENTS

| 9,334,444 | B1* | 5/2016 | Yang et al. | |
|---|---|---|---|---|
| 2011/0272585 | A1* | 11/2011 | Yang et al. | 250/362 |
| 2013/0126741 | A1* | 5/2013 | Srivastava et al. | 250/362 |

OTHER PUBLICATIONS

Combes et al., "Optical and scintillation properties of pure and Ce3+-doped Cs2LiYCl6 and Li3YCl6 : Ce3+ crystals," Journal of Luminescence, 82, Jan. 11, 1999, pp. 299-305.
(Continued)

*Primary Examiner* — David Porta
*Assistant Examiner* — Hugh H Maupin
(74) *Attorney, Agent, or Firm* — Andrews Kurth Kenyon LLP

(57) ABSTRACT

The present disclosure is directed to a group of newly discovered intrinsic scintillation compounds. As intrinsic scintillators, these compounds do not require an external activator as a dopant. The new scintillators may include members of two elpasolite families with the general exemplary formulas of $A_2BMX_{(6-y)}X'_y$ and $A_3MX_{(6-y)}X'_y$, (0<y<6). Component A may include at least one element selected from the group consisting alkali elements and thallium (Li, Na, K, Rb, Cs and Tl); Component B may include at least one element, different from the at least one element of component A, selected from the group consisting alkali elements (Li, Na, K, Rb, and Cs); Component M may include at least one element selected from the group consisting tri-valence elements (La, Gd, Lu, Bi, Y); Component X may include at least one element selected from the group consisting halide elements (F, Cl, Br and I); Component X' may include at least one element, different from the at least one element of component X, selected from the group consisting halide elements (F, Cl, Br and I). The value of y may be in a range between 0 and 6 non-inclusively (i.e. 0<y<6, or y={1, 2, 3, 4, 5}).

15 Claims, 46 Drawing Sheets

(51) Int. Cl.
    *C30B 29/12*    (2006.01)
    *C09K 11/77*    (2006.01)
    *C30B 11/00*    (2006.01)

(56) References Cited

OTHER PUBLICATIONS

Gridin et al.,"Optical and scintillation properties of CsI:In crystals", Functional Materials, 20, No. 3, Mar. 12, 2013, pp. 284-289.
Glodo et al., "Selected Properties of Cs2LiYCl6, Cs2LiLaCl6, and Cs2LiLaYBr6 Scintillators", IEEE Transactions on Nuclear Science, vol. 58, No. 1, Feb. 1, 2011, pp. 333-338.
Hoftstadter et al., "The Measurement of Gamma-Ray Energies with Single Crystals of NaI(Tl)", The Physical Review, 80 (4), Nov. 15, 1950, pp. 631-637.
Dorenbos, "Fundamental Limitations in the Performance of Ce3+-, Pr3+-, and Eu2+-Activated Scintillators", IEEE Transactions on Nuclear Science, 57 (3), Jun. 2010, pp. 1162-1167.
Grabmaier, "Crystal Scintillators", IEEE Transactions on Nuclear Science, NS-31(1), Feb. 1984, pp. 372-376.
Yang et al., "The Synthesis and Structures of Elpasolite Halide Scintillators", Materials Research Society Symposium Proceedings, vol. 1164, 2009 (month unknown), pp. 185-192.
Krupski, "Rigid Sphere Model of the Phase Transitions in Complex Antifluorite and Elpasolite Compounds", Physica Status Solidi (a) Applied Research, 116 (2), Dec. 1989, pp. 657-668.
Wei et al., "Effect of Ba substitution in CsSrI3 : Eu2+", Journal of Crystal Growth, 384, Jul. 31, 2013, pp. 27-32.
Van Loef et al., "Optical and Scintillation Properties of Cs2Li-YCl6 : Ce3+ and Cs2LiYCl6 : Pr3+ Crystals", IEEE Transactions on Nuclear Science, 52(5), Oct. 2005, pp. 1819-1822.
Bollinger et al., "Measurement of the Time Dependence of Scintillation Intensity by a Delayed-Coincidence Method", The Review of Scientific Instruments, 32(9), Sep. 1961, pp. 1044-1050.
Wei et al., "Scintillation Properties of Cs3 LaCl6:Ce3+and Cs3LaBr6:Ce3+", IEEE Transactions on Nuclear Science, vol. 61, No. 1, Feb. 2014, 7 pages.
Wei et al., "Two new cerium-doped mixed-anion elpasolite scintillators:Cs2NaYBr3I3 and Cs2NaLaBr3I3", Optical Materials 38, Oct. 27, 2014, pp. 154-160.
Wei et al., "The scintillation properties of CeBr3_xClx single crystals", Journal of Luminescence 156, Aug. 14, 2014, pp. 175-179.
Wei et al., "Temperature dependence spectroscopic study of Ce-doped Cs3LaCl6 and Cs3LaBr6 scintillators", Journal of Luminescence 160, Dec. 8, 2014, pp. 64-70.
Melcher et al., "Cerium-doped Lutetium Oxyorthosilicate: A Fast, Efficient New Scintillator", IEEE Transactions on Nuclear Science, vol. 39, No. 4, Aug. 1992, pp. 502-505.
Moszynski et al., "Properties of the YAP: Ce scintillator", Nuclear Instruments and Methods in Physics Research Section A 404, Jan. 1998, pp. 157-165.
Wei et al., "Effect of Ba substitution in CsSrI3:Eu2+", Journal of Crystal Growth 384, Sep. 18, 2013, pp. 27-32.

* cited by examiner

INTRINSIC COMPLEX HALIDE ELPASOLITE SCINTILLATORS AND METHODS OF MAKING AND USING SAME

CROSS-REFERENCE TO RELATED APPLICATIONS

This application claims benefit under 35 U.S.C. §119(e) of U.S. Provisional Application Ser. No. 61/981,350, filed Apr. 18, 2014, which is incorporated herein by reference in entirety.

BACKGROUND

A scintillator is a material that can absorb high-energy particles and convert these particles to multiple low-energy photons. Scintillation materials are scientifically and economically significant in conjunction with photodetectors to detect high-energy photons, electrons and other particles in various applications, which include medical imaging, geological exploration, homeland security, and high-energy physics. In order to maximize the scintillator's values in the applications, characteristics including high scintillation light yield, fast scintillation decay time and rise time, good energy resolution, high degree of proportionality, proper emission wavelength, and good thermal response over a wide temperature range are desired. To these ends, it is important to obtain electron/hole traps and defect free scintillators.

Elpasolite scintillators are a promising class of scintillators, with good scintillation properties and symmetric structure. For example, $Cs_2LiYCl_6$ doped with cerium scintillators are fabricated and used as gamma-ray and neutron detectors, as described in "Optical and scintillation properties of $Cs_2LiYCl_6:Ce^{3+}$ and $Cs_2LiYCl_6:Pr^{3+}$ crystals," by E. Van Loef et al., *IEEE Transactions on Nuclear Science*, 2005, 52, 1819-1822. In addition, $Cs_2LiYCl_6$ doped with cerium also has nearly perfect proportionality response. As another example, in "Selected Properties of $Cs_2LiYCl_6$, $Cs_2LiLaCl_6$, and $Cs_2LiLaYBr_6$ Scintillators," *IEEE Transactions on Nuclear Science*, 2011, 58, 333-338, Glodo et al. reported the scintillation properties of $Cs_2LiLaCl_6$ and $Cs_2LiLaBr_6$ doped with cerium single crystals. In addition, Combes et al. reported the scintillation properties of undoped $Cs_2LiYCl_6$ in "Optical and scintillation properties of pure and $Ce^{3+}$-doped $Cs_2LiYCl_6$ and $Li_3YCl_6:Ce^{3+}$ crystals," *Journal of Luminescence*, 1999, 82, 299-305. In a further example, General Electric Company filed a patent application covering cerium doped elpasolite halides scintillators, titled "Activated mixed halide elpasolites and high energy resolution scintillator" and published as U.S. Patent App. Pub. No. US 2013/0126741.

Common dopants used to externally activate scintillation compounds include $Ce^{3+}$, $Pr^{3+}$, $Eu^{2+}$, $In^+$, $Na^+$ and $Tl^+$. However, the limitations of externally activated scintillators have been recognized, as noted in "Fundamental Limitations in the Performance of $Ce^{3+}$, $Pr^{3+}$, and $Eu^{2+}$ Activated Scintillators," by Dorenbos, *IEEE Transactions on Nuclear Science*, 2010, 57 (3), 1162-1167. In addition, the use of dopants increases material, manufacturing, and production costs, and as these materials may be highly reactive or toxic, special safety and handling procedures are often required.

DETAILED DESCRIPTION

Figure 1A:
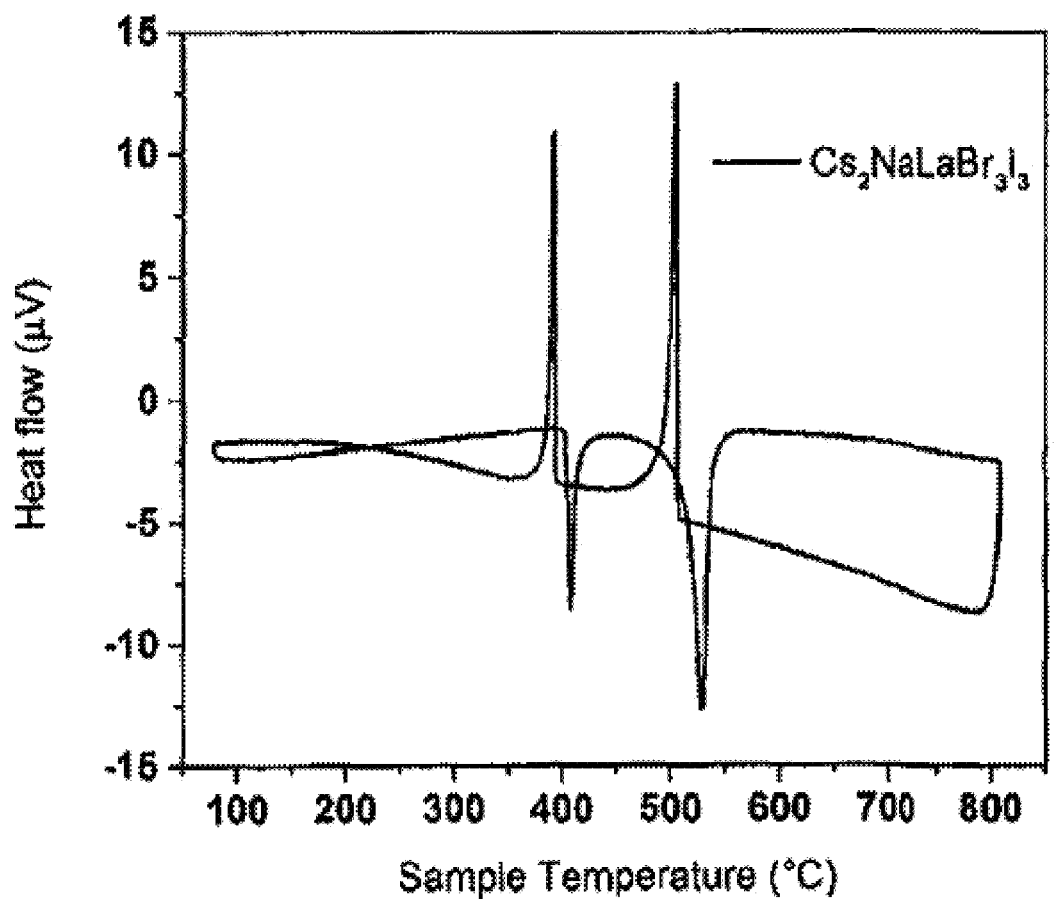
FIG. 1A illustrates differential scanning calorimetry data for an exemplary $Cs_2NaLaBr_3I_3$ intrinsic scintillator.

It has since been discovered that self-trapped excitons (STE) are the primary drivers of the scintillation mechanism. External activators, such as the commonly used $Ce^{3+}$, $Pr^{3+}$, $Eu^{2+}$, $In^+$, $Na^+$ and $Tl^+$ dopants discussed above, were thought to compel the scintillation process, but it has been demonstrated that STE are the primary contributions to scintillation.

Thus, the present disclosure is directed to a group of newly discovered intrinsic scintillation compounds. As intrinsic scintillators, these compounds do not require an external activator as a dopant. These compounds can be fabricated into intrinsic scintillators, without the necessities of external doping, in order to provide the optimal performance for any giving application.

Intrinsic scintillators according to an embodiment of this invention may include members of two elpasolite families with the following general exemplary formulas:

$$A_2BMX_{(6-y)}X'_y \quad (1)$$

and

$$A_3MX_{(6-y)}X'_y \quad (2)$$

where $0<y<6$.

In the above formulas, component A may include at least one element selected from the group consisting of alkali elements (Li, Na, K, Rb, and Cs) and thallium (Tl); component B may include at least one element, different from the at least one element of component A, selected from the group consisting alkali elements (Li, Na, K, Rb, and Cs); component M may include at least one element selected from the group consisting tri-valence elements (La, Gd, Lu, Bi, Y); component X may include at least one element selected from the group consisting halide elements (F, Cl, Br and I); component X' may include at least one element, different from the at least one element of component X, selected from the group consisting halide elements (F, Cl, Br and I). The value of y may be in a range between 0 and 6 non-inclusively (i.e. $0<y<6$, or $y=\{1, 2, 3, 4, 5\}$).

These compounds can form excellent intrinsic scintillators without the need for doping with an activator such as $Ce^{3+}$, $Pr^{3+}$, $Eu^{2+}$, $In^+$, $Na^+$ and $Tl^+$. These new intrinsic scintillators may be suitable for radiation detection applications including medical imaging, geophysical exploration, homeland security and high energy physics experiments. These scintillators may also have other notable properties, such as highly symmetric crystal structure, fast decay time, high light output, suitable emission wavelength, and low melting point.

Embodiments of methods of making intrinsic complex halide elpasolite scintillators are now discussed. According to one embodiment, anhydrous high purity (4N or 5N) starting materials from Sigma-Aldrich were hand mixed in stoichiometric ratio according to the chemical formulas of the respective compounds and loaded into clean quartz ampoules. The mixing and loading were done in a dry glove box with moisture and oxygen content of less than 0.1 ppm.

The starting materials were subsequently dried in the quartz ampoule under $10^{-6}$ torr vacuum at 200-250° C. for 5 hours, cooled down to room temperature, and sealed inside of the quartz ampoule under vacuum with a hydrogen/oxygen torch. A single zone furnace was used to melt and synthesize the compounds, according to the following formulas (1) and (2) above. That is, the formula $A_2BMX_{(6-y)}X'_y$ (1), where A is one of Li, Na, K, Rb, Cs, and Tl; where B is one of Li, Na, K, Rb, and Cs; where M is one of La, Gd, Lu, Bi, Y; and where X and X' are one of F, Cl, Br, and I; and the formula $A_3MX_{(6-y)}X'_y$ (2), where A is one of Li, Na, K, Rb, and Cs, where M is one of La, Gd, Lu, Bi, and Y, and where X and X' are one of F, Cl, Br, and I.

In this embodiment, the melt and synthesis temperature was raised to 20-50° C. above the highest melting temperature of the starting materials used. This temperature was held for 5-10 hours and slowly cooled down to room temperature in 10 hours. The ampoule was inverted and the procedure above was repeated to encourage complete mixing and reacting of all starting materials. This resulted in polycrystalline samples. The synthesis techniques including without limitation, Bridgman method, Electronic Dynamic Gradient (EDG) method, Czochralski method, Micro-pulling down method, thin film deposition, and ceramic hot pressing, may be used to produce the final product in poly-crystal, single crystal, thin film and ceramic forms.

According to another embodiment, the starting material may be mixed using a multiple ampoule alternating ("MAA") mixing process. MAA mixing is a multiple melt-mixing process in which the ampoule's orientation in a vertical furnace is inverted one time, or several times, in order to facilitate uniform mixing of all starting materials for chemical reactions. MAA mixing provides for a more homogeneous distribution of starting materials and improved mixture transparency. The number of inversions employed in an MAA mixing process may be determined by a variety of factors including, for example, the particular starting materials, intended chemical reactions, form of the resultant product, and temperature. Additional detail on multiple ampoule alternating mixing methods is presented by Wei et al. in "Scintillation Properties of $Cs_3LaCl_6:Ce^{3+}$ and $Cs_3LaBr_6:Ce^{3+}$," *IEEE Transactions on Nuclear Science*, 2014, 61, 390-396, the disclosure of which is incorporated herein by reference.

Exemplary intrinsic complex halide elpasolite scintillators according to the present disclosure include crystals of formula (1), i.e., $A_2BMX_{(6-y)}X'_y$, where A is one of Li, Na, K, Rb, Cs, and Tl; where B is one of Li, Na, K, Rb, and Cs; where M is one of La, Gd, Lu, Bi, and Y; and where X and X' are one of F, Cl, Br, and I; and crystals of formula (2), i.e., $A_3MX_{(6-y)}X'_y$, where A is one of Li, Na, K, Rb, Cs, and Tl; where M is one of La, Gd, Lu, Bi, Y; and where X and X' is one of F, Cl, Br, and I. Scintillation properties of several of these exemplary scintillators are presented in Tables I and II below.

TABLE I

Scintillation Properties of Formula (1) ($A_2BMX_{(6-y)}X'_y$) Examples

| Composition | Light Yield (ph/MeV) | Energy Resolution (at 662 keV) | Radioluminescence Peak (nm) | Scintillation Decay (ns) | Scintillation rise (ns) |
|---|---|---|---|---|---|
| $Cs_2NaLaBr_3I_3$ | ~37,500 | 8.1% | 433 | 450 (16%), 1500 (84%) | 15.1 |
| $Cs_2NaYBr_4I_2$ | ~14,200 | 9.8% | 399 | 252 (20%), 918 (80%) | 15.1 |
| $Cs_2NaYBr_3I_3$ | ~40,000 | 4.3% | 403 | 240 (17%), 960 (83%) | 15.1 |
| $Cs_2KLaBr_3I_3$ | ~32,000 | 6.2% | 437 | 280 (24%), 900 (76%) | 15.1 |

TABLE II

Scintillation Properties of Formula (2) ($A_3MX_{(6-y)}X'_y$) Examples

| Composition | Light Yield (ph/MeV) | Energy Resolution (at 662 keV) | Radioluminescence Peak (nm) | Scintillation Decay (ns) | Scintillation rise (ns) |
|---|---|---|---|---|---|
| $Cs_3LaBr_3I_3$ | ~28,000 | 7.5% | 454 | 496 (14%), 1609 (86%) | 15.9 |
| $Cs_3YBr_3I_3$ | ~35,000 | 5.6% | 402 | 400 (16%), 1336 (84%) | 15.9 |

Differential Scanning calorimetry of Exemplary Intrinsic Scintillators

The melting points and crystallization points for exemplary intrinsic scintillators were measured using a Setaram Labsys Evo Differential Scanning calorimeter (DSC). Samples were heated and cooled at 5° C./min between 25° C. and 900° C. under flowing argon gas. Based on measurements of standard reference materials, the temperature accuracy is ±2° C. DSC data from exemplary intrinsic scintillators is presented in FIGS. 1A to 1C.

Figure 1B:
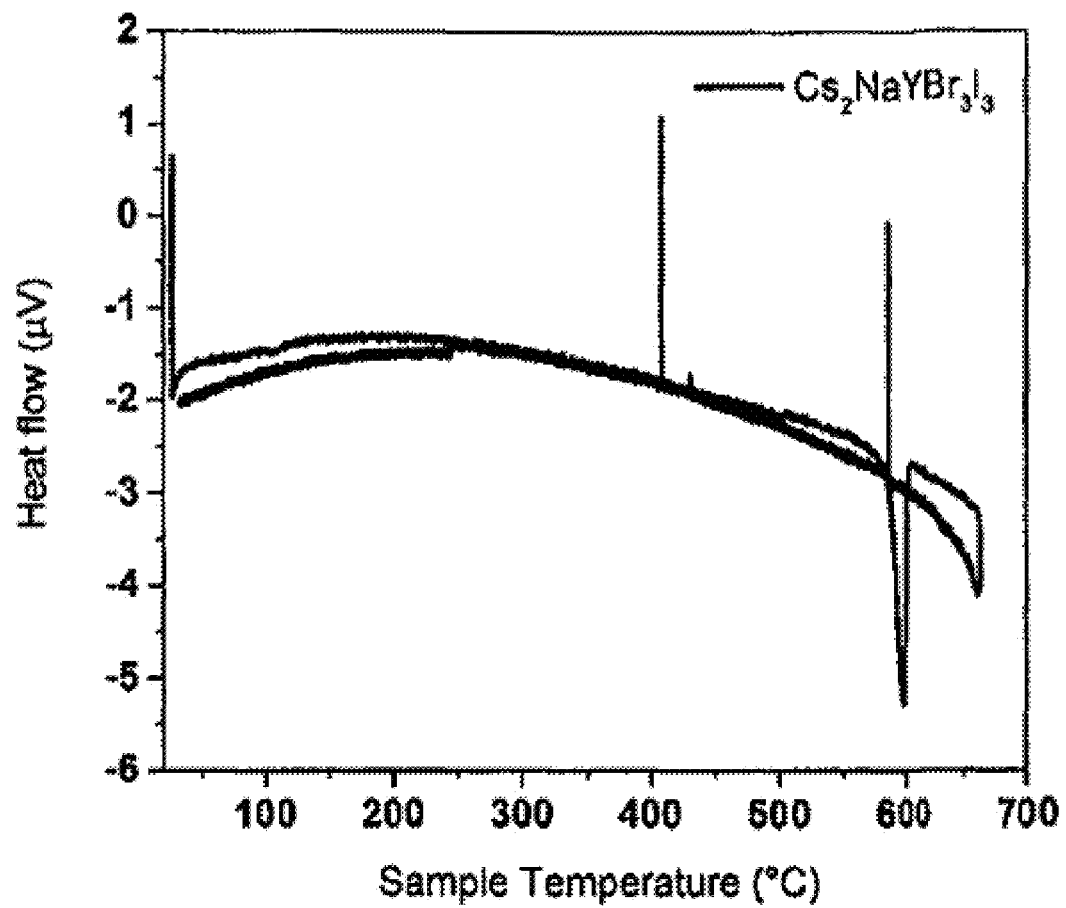
FIG. 1B illustrates differential scanning calorimetry data for an exemplary $Cs_2NaYBr_3I_3$ intrinsic scintillator.
Figure 1C:
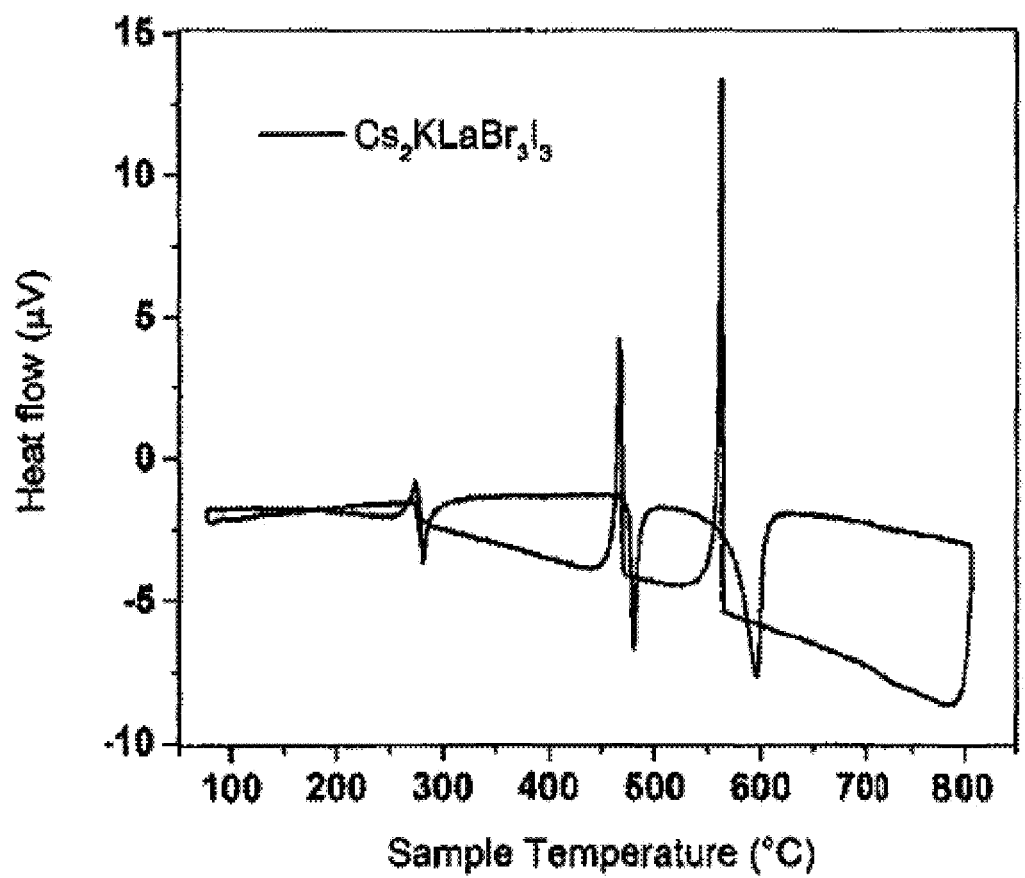
FIG. 1C illustrates differential scanning calorimetry data for an exemplary $Cs_2KLaBr_3I_3$ intrinsic scintillator.

FIG. 1A presents DSC data measured for an exemplary $Cs_2NaLaBr_3I_3$ intrinsic scintillator. As shown in this figure, the DSC curve of the $Cs_2NaLaBr_3I_3$ intrinsic scintillator indicates the melting temperature is 506° C. FIG. 1B shows DSC data measured for an exemplary $Cs_2NaYBr_3I_3$ intrinsic scintillator, and this DSC curve indicates that the melting temperature is 580° C. In FIG. 1C, DSC data for an exemplary $Cs_2KLaBr_3I_3$ intrinsic scintillator is shown, and this data indicates that the melting temperature is 575° C.

X-Ray Powder Diffraction of Exemplary Intrinsic Scintillators

X-ray powder diffraction (XRD) spectra of exemplary scintillators were measured with a Bruker D2 Phaser diffractometer. The samples of the scintillator material were grounded into powder in a nitrogen-purged glove box and loaded into airtight Kapton sample holders. The X-ray tube voltage was 30 kV and the current was 10 mA. The two-theta angle was scanned from 10° to 70° in 0.02° steps. The crystal structure was resolved by XRD analysis software JADE 6. XRD spectra from several exemplary intrinsic scintillators is presented in FIGS. 2A to 2D.

Figure 2A:
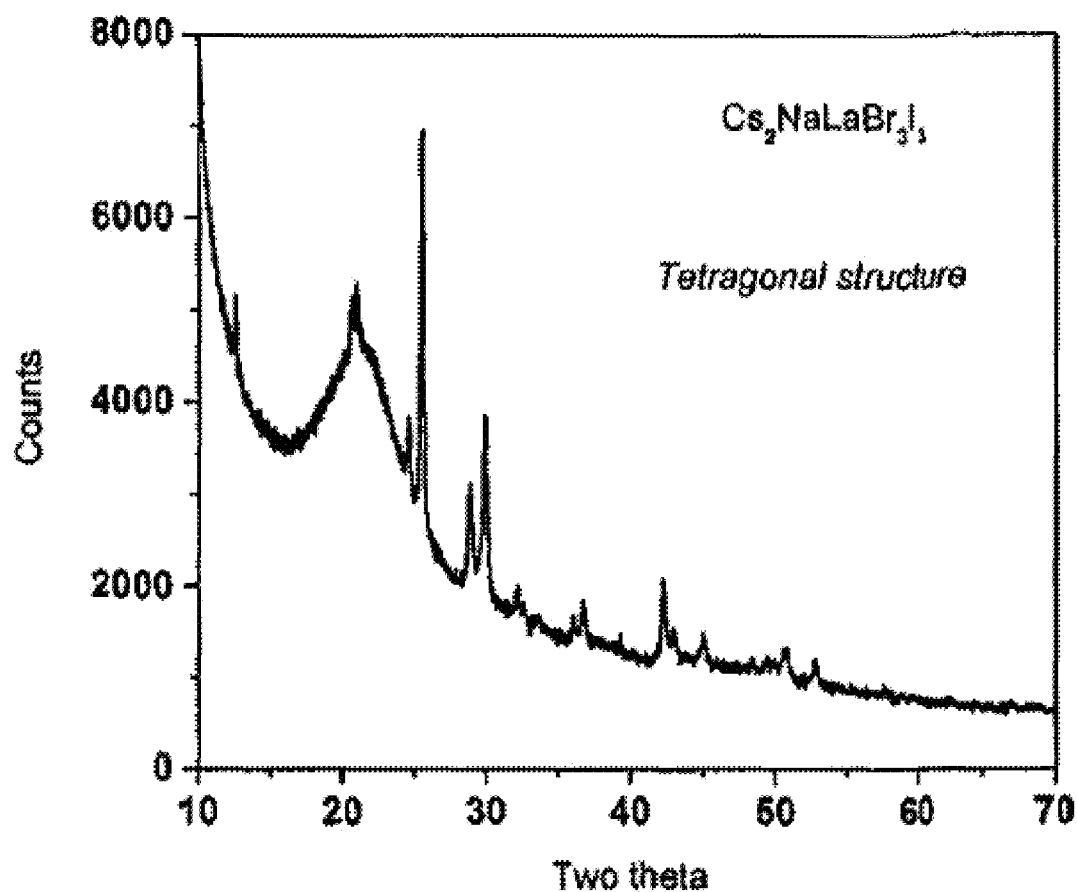
FIG. 2A illustrates X-ray powder diffraction spectra for an exemplary $Cs_2NaLaBr_3I_3$ intrinsic scintillator.
Figure 2B:
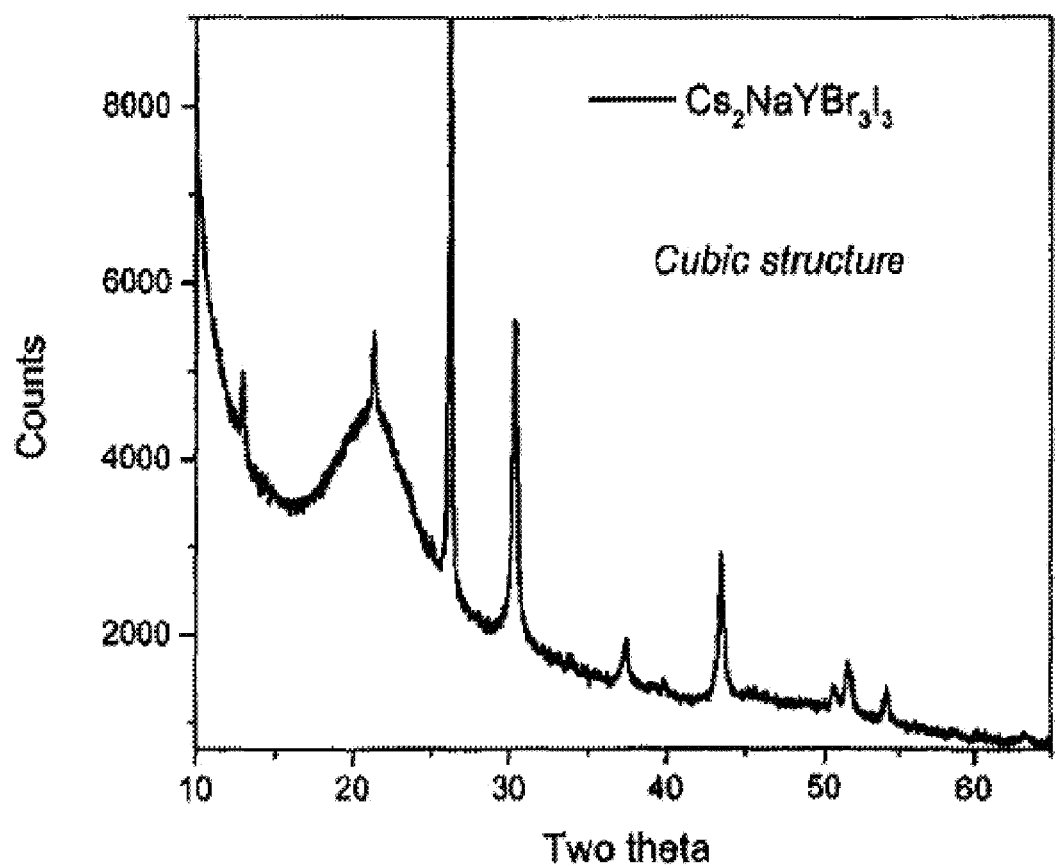
FIG. 2B illustrates X-ray powder diffraction spectra for an exemplary $Cs_2NaYBr_3I_3$ intrinsic scintillator.
Figure 2C:
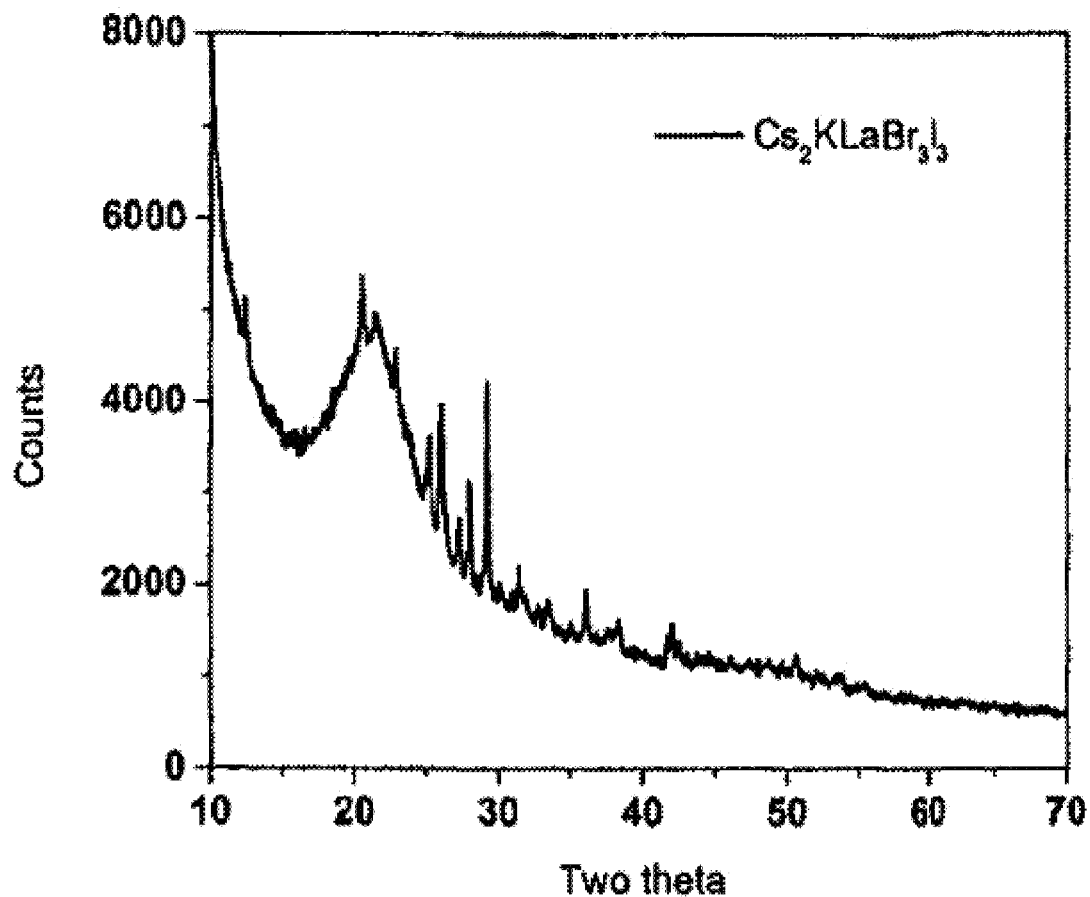
FIG. 2C illustrates X-ray powder diffraction spectra for an exemplary $Cs_2KLaBr_3I_3$ intrinsic scintillator.
Figure 2D:
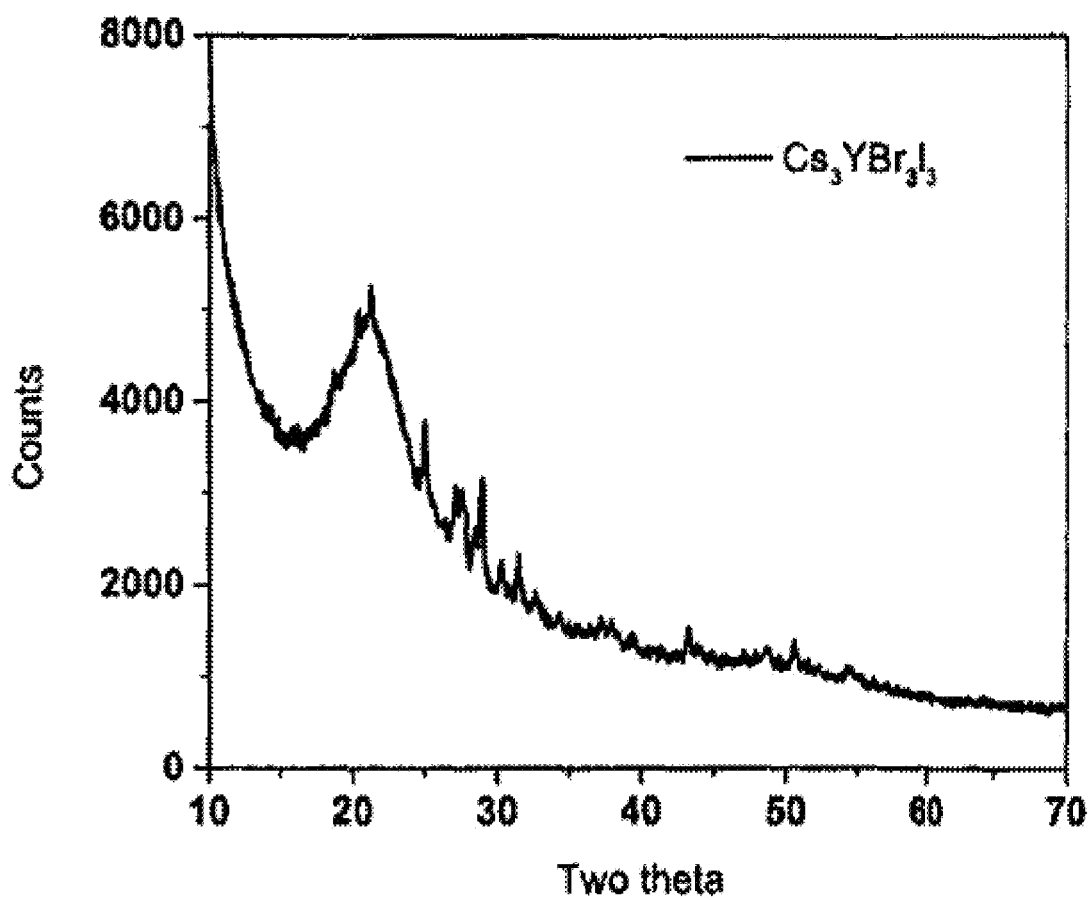
FIG. 2D illustrates X-ray powder diffraction spectra for an exemplary $Cs_3YBr_3I_3$ intrinsic scintillator.

FIG. 2A presents XRD spectra of an exemplary $Cs_2NaLaBr_3I_3$ intrinsic scintillator. As shown in this figure, this scintillator has a tetragonal crystal structure. XRD spectra of an exemplary $Cs_2NaYBr_3I_3$ intrinsic scintillator is illustrated in FIG. 2B, and this pattern shows that the $Cs_2NaYBr_3I_3$ intrinsic scintillator has a cubic crystal structure. FIGS. 2C and 2D presents XRD spectra for exemplary $Cs_2KLaBr_3I_3$ and $Cs_3YBr_3I_3$ intrinsic scintillators, respectively.

Radioluminescence of Exemplary Intrinsic Scintillators

Radioluminescence spectra of exemplary intrinsic scintillators were measured at room temperature under continuous irradiation from an X-ray generator model CMX003 (at 35 kV and 0.1 mA). A model PI Acton Spectra Pro SP-2155 monochromator was used to record the spectra. Exemplary intrinsic scintillator crystals of formulas (1) and (2) show broad (or wide) emission peak from 300 nm to 650 nm, which is distinct from the narrow emission of non-intrinsic scintillators doped with $Ce^{3\pm}$. FIGS. 3A to 3F illustrate the radioluminescence emission of several exemplary intrinsic scintillators of formulas (1) and (2).

Figure 3A:
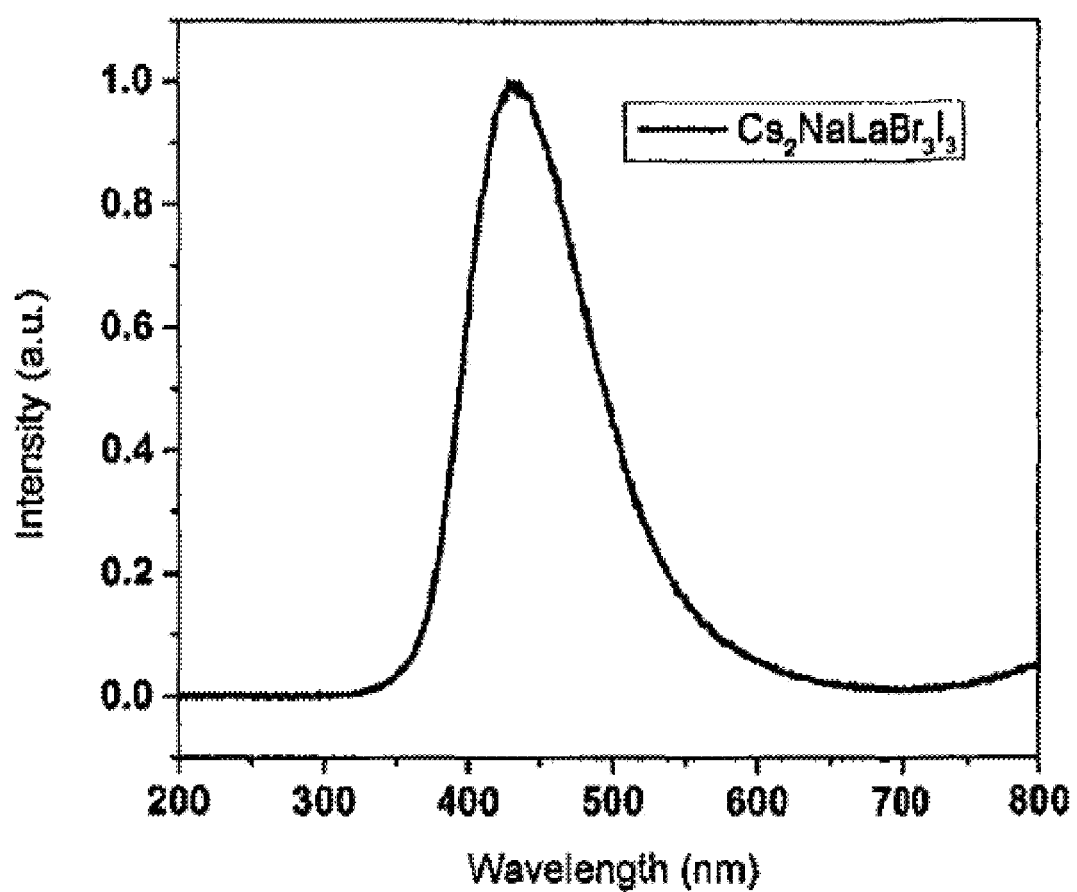
FIG. 3A illustrates radioluminescence spectra of an exemplary $Cs_2NaLaBr_3I_3$ intrinsic scintillator.
Figure 3B:
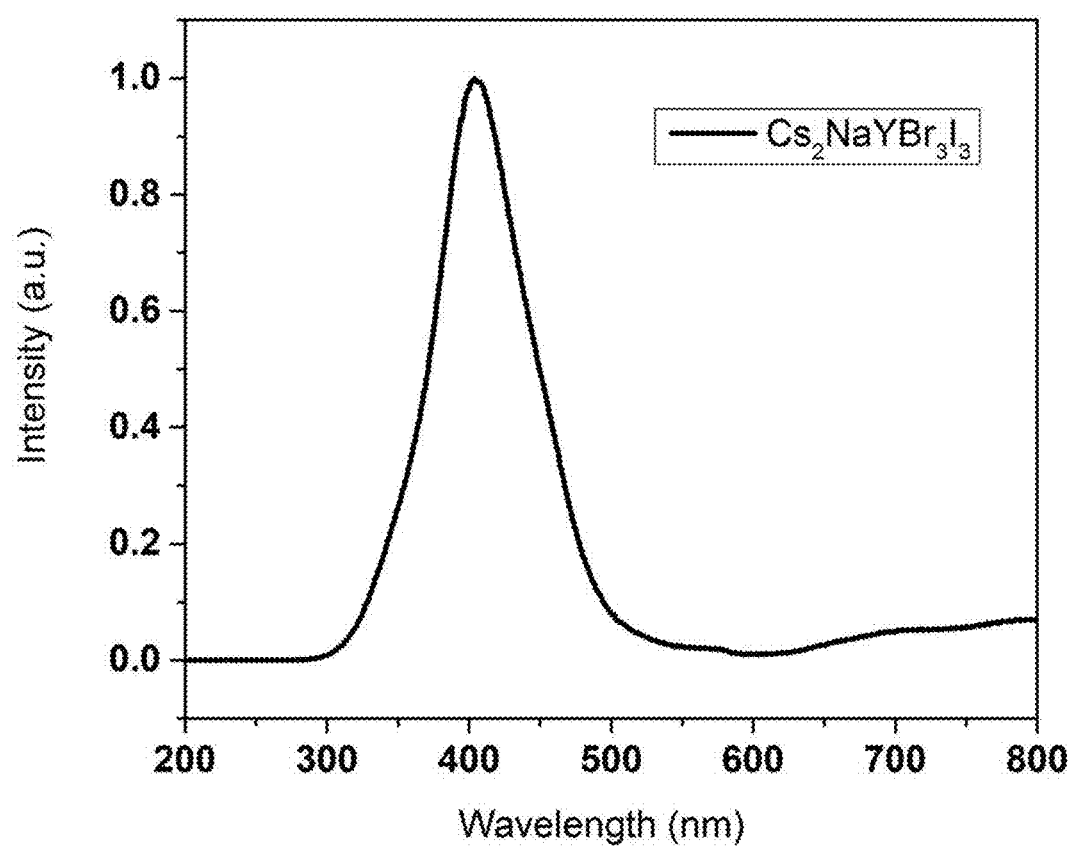
FIG. 3B illustrates radioluminescence spectra of an exemplary $Cs_2NaYBr_3I_3$ intrinsic scintillator.
Figure 3C:
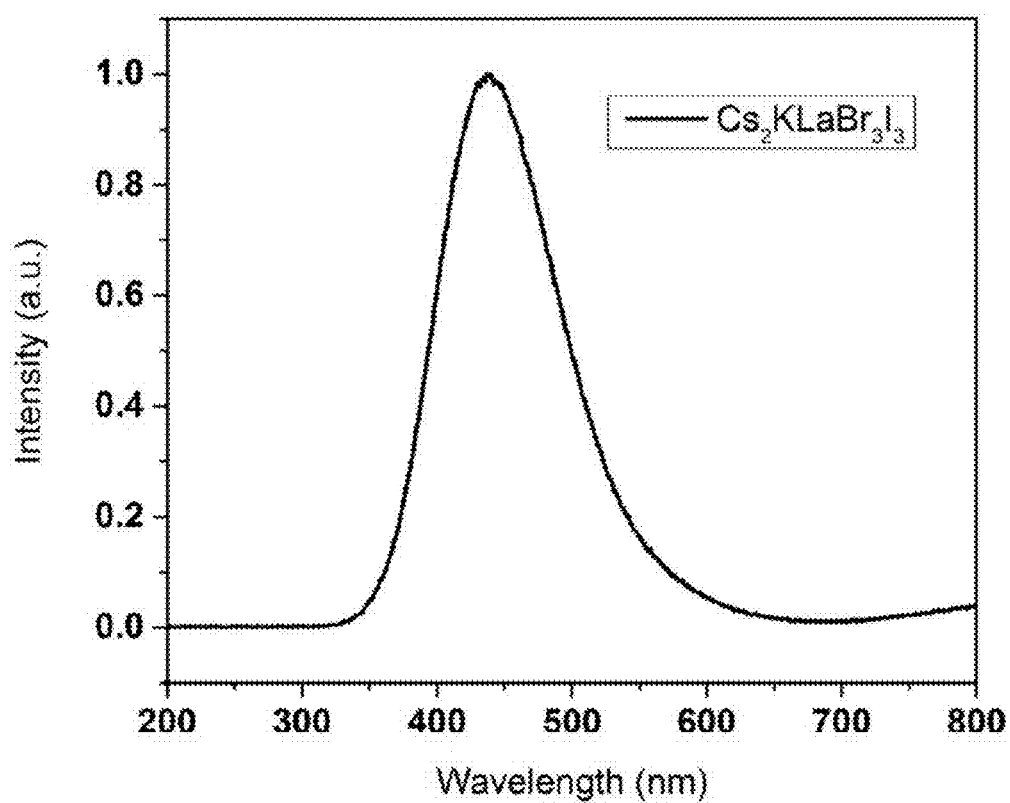
FIG. 3C illustrates radioluminescence spectra of an exemplary $Cs_2KLaBr_3I_3$ intrinsic scintillator.
Figure 3D:
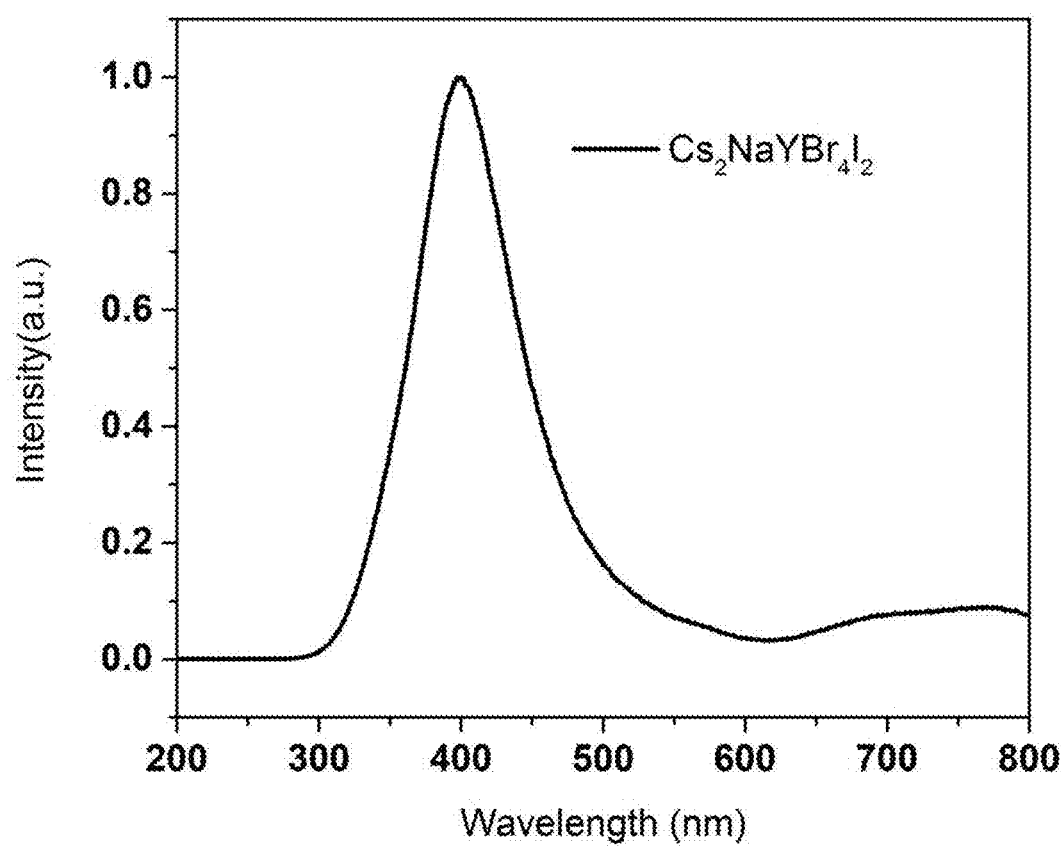
FIG. 3D illustrates radioluminescence spectra of an exemplary $Cs_2NaYBr_4I_2$ intrinsic scintillator.
Figure 3E:
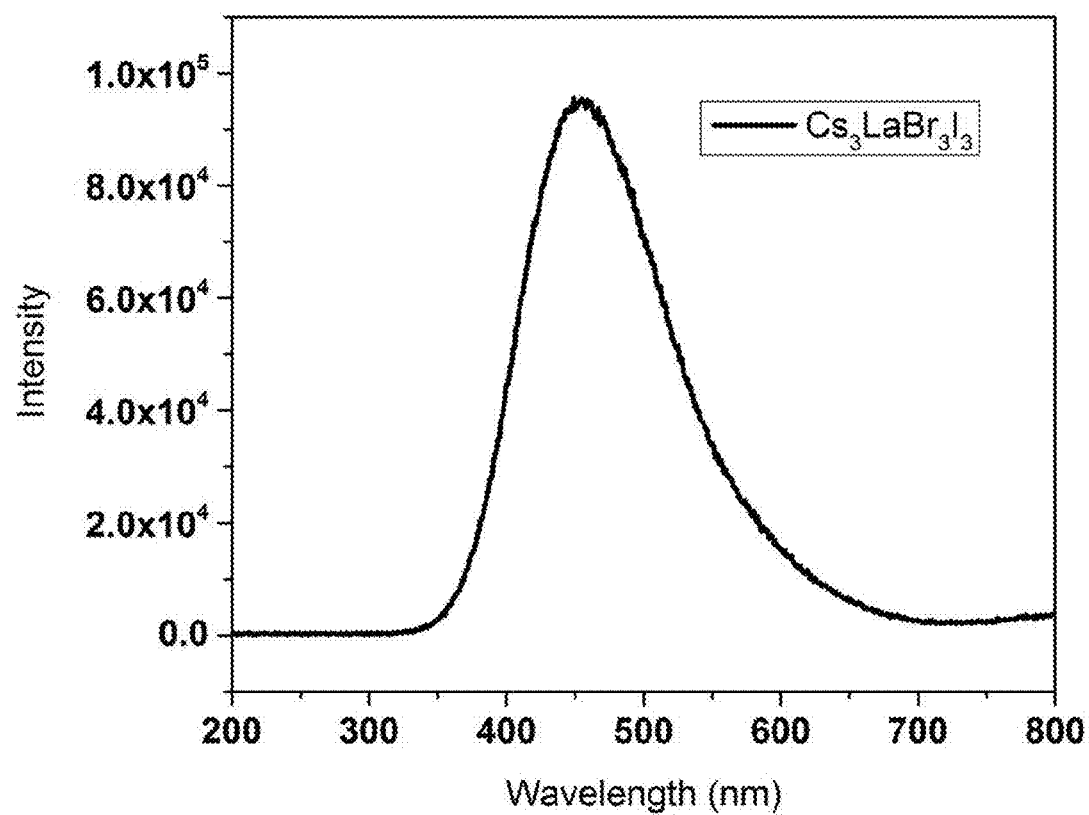
FIG. 3E illustrates radioluminescence spectra of an exemplary $Cs_3LaBr_3I_3$ intrinsic scintillator.
Figure 3F:
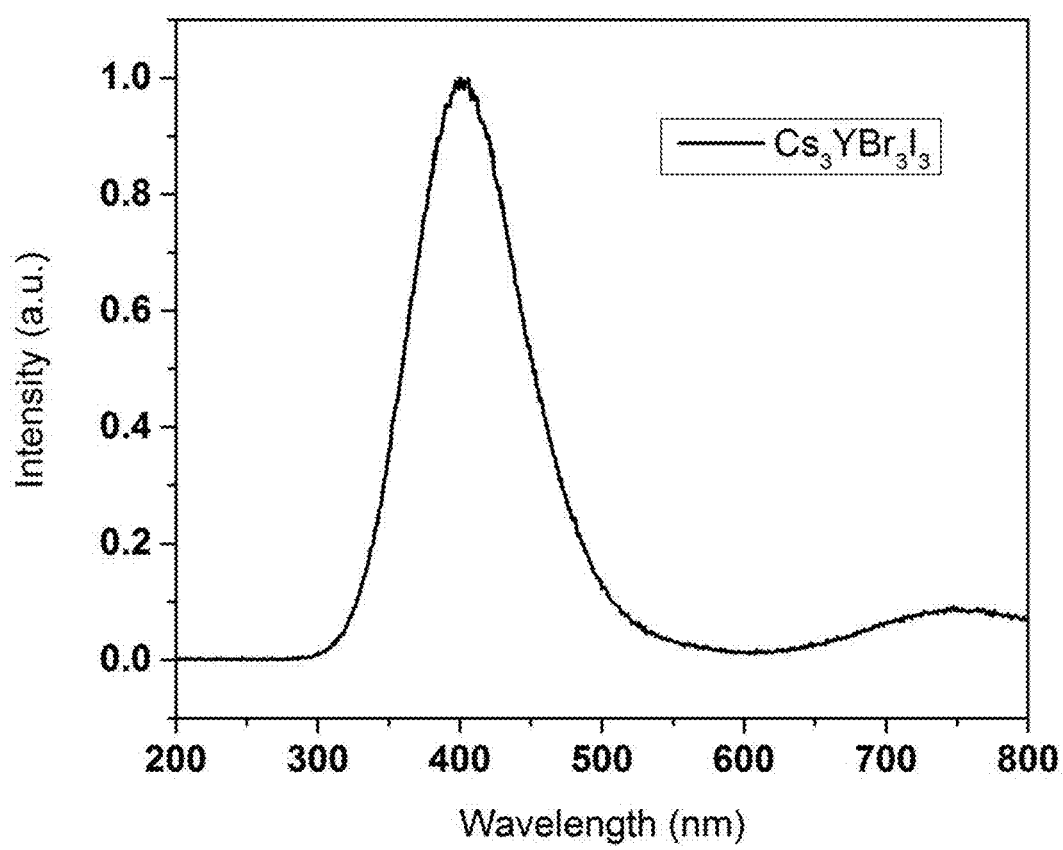
FIG. 3F illustrates radioluminescence spectra of an exemplary $Cs_3YBr_3I_3$ intrinsic scintillator.

FIG. 3A presents radioluminescence spectra of an exemplary $Cs_2NaLaBr_3I_3$ intrinsic scintillator, which has a broad peak that ranges from 320 nm to 700 nm. In FIG. 3B, the radioluminescence spectra of an exemplary $Cs_2NaYBr_3I_3$ intrinsic scintillator is shown, and this scintillator has a broad peak that ranges from 305 nm to 600 nm. FIG. 3C presents radioluminescence spectra of an exemplary $Cs_2KLaBr_3I_3$ intrinsic scintillator, which has a broad peak that ranges from 320 nm to 700 nm. In FIG. 3D, the radioluminescence spectra of an exemplary $Cs_2NaYBr_4I_2$ intrinsic scintillator is shown, and this scintillator has a broad peak that ranges from 300 nm to 600 nm. FIG. 3E presents radioluminescence spectra of an exemplary $Cs_3LaBr_3I_3$ intrinsic scintillator, which has a broad peak that ranges from 325 nm to 700 nm. In FIG. 3F, the radioluminescence spectra of an exemplary $Cs_3YBr_3I_3$ intrinsic scintillator is shown, and this scintillator has a broad peak that ranges from 315 nm to 600 nm.

Scintillation Light Yield of Exemplary Intrinsic Scintillators

Scintillation light yield of exemplary intrinsic scintillators was measured by coupling a sample scintillator crystal to a Hamamatsu 3177-50 or R6231-100 photomultiplier tube (PMT) and recording the response to gamma rays (from for example a $^{137}Cs$ (Cesium-137 isotope) button source). A hemispherical dome of Spectralon was used to reflect and concentrate the scintillation light into the PMT, and mineral oil was used to protect the sample scintillator crystal from degradation, as well as to provide an optical coupling between the sample scintillator crystal and the PMT such that scintillation light generated in the sample scintillator crystal would transmit to the PMT for measurement. The PMT detected the scintillation light and converted the light into electrical signals, which were then amplified by a Canberra 2005 pre-amp and an Ortec 672 amplifier with a shaping time of 10 μs. A multiple channel analyzer (Tukan 8K) was used to count and histogram the detected pulses of the scintillation light. The pulse height spectra of the sample scintillator crystals of formulas (1) and (2) are shown in FIGS. 4A to 4F. The full-energy peak (photopeak) is fit by Gaussian function in these figures.

Figure 4A:
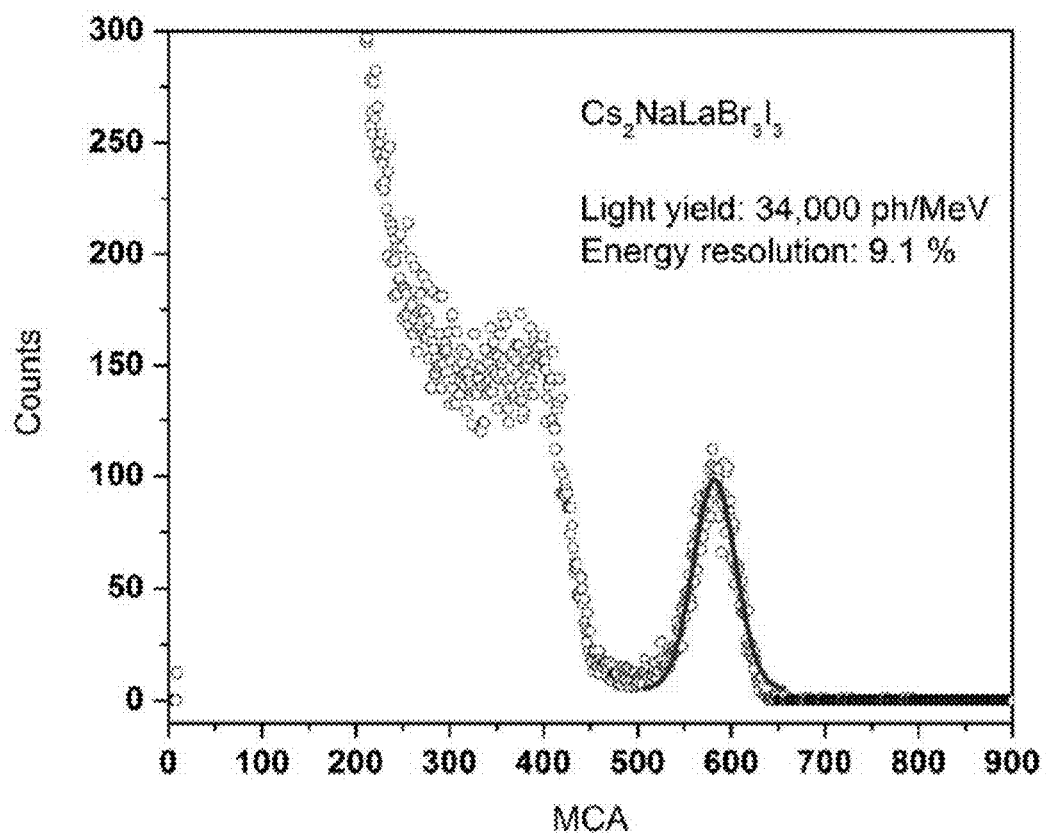
FIG. 4A illustrates the pulse height spectrum of an exemplary $Cs_2NaLaBr_3I_3$ intrinsic scintillator.
Figure 4B:
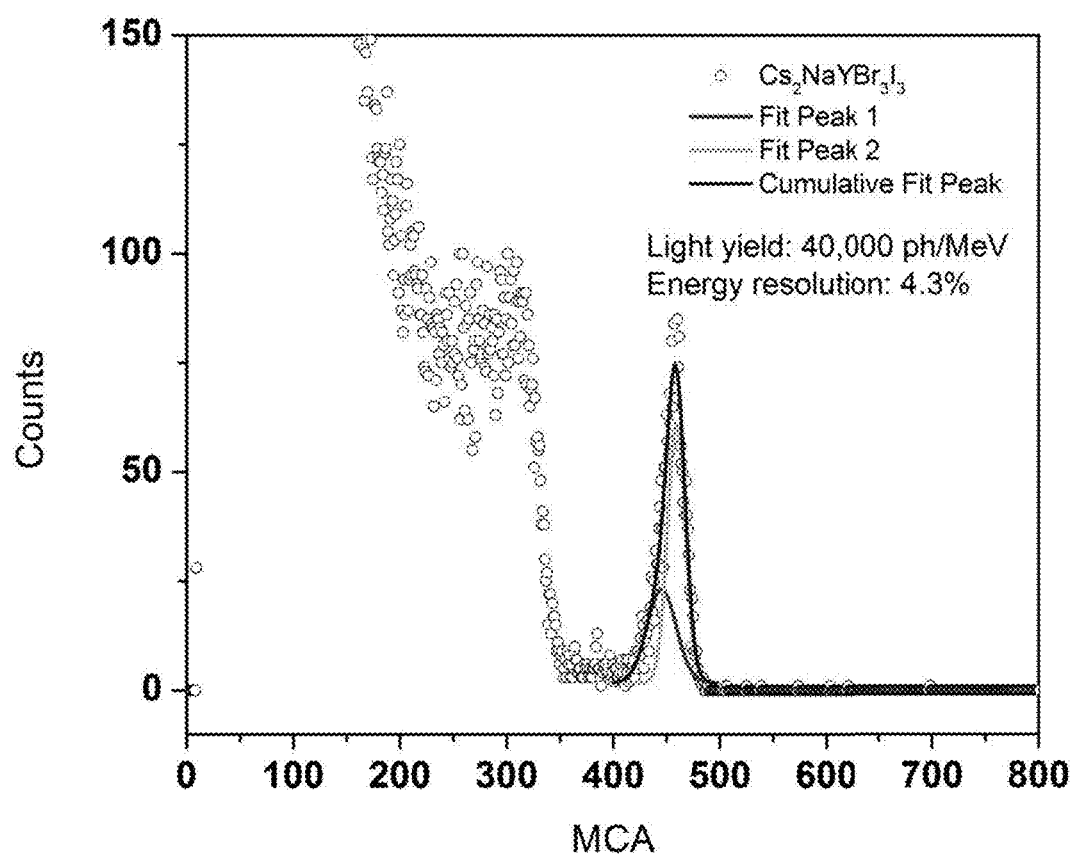
FIG. 4B illustrates the pulse height spectrum of an exemplary $Cs_2NaYBr_3I_3$ intrinsic scintillator.
Figure 4C:
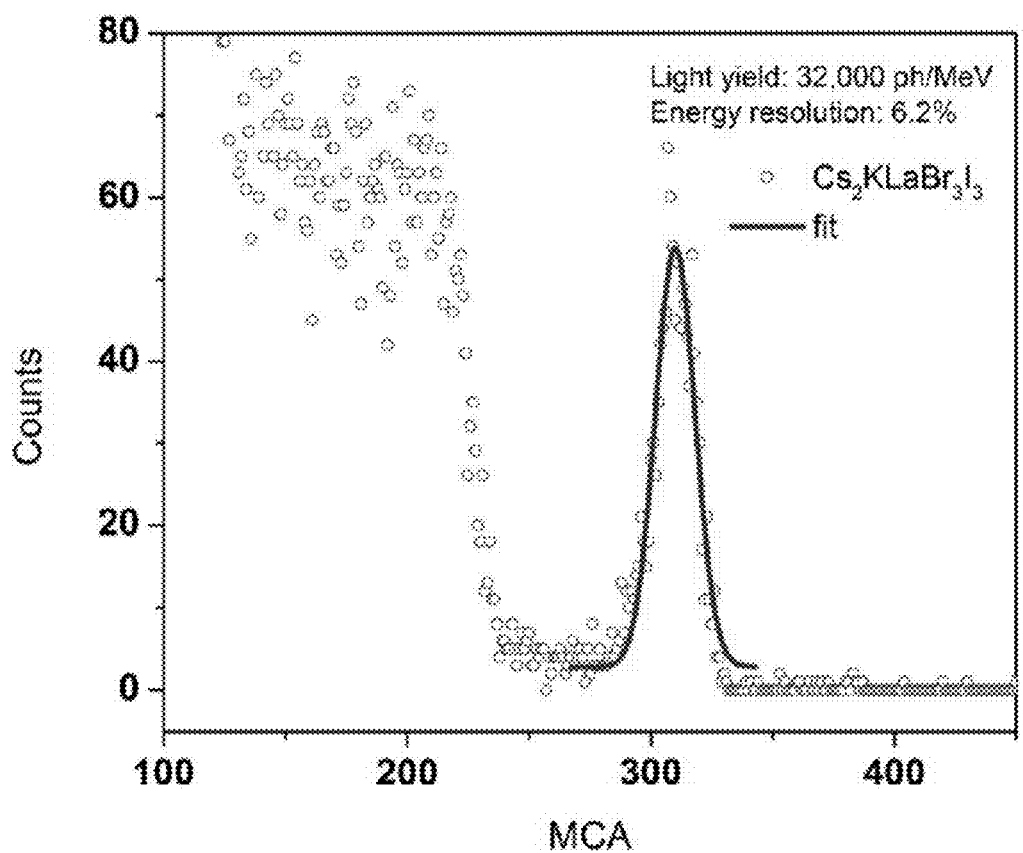
FIG. 4C illustrates the pulse height spectrum of an exemplary $Cs_2KLaBr_3I_3$ intrinsic scintillator.
Figure 4D:
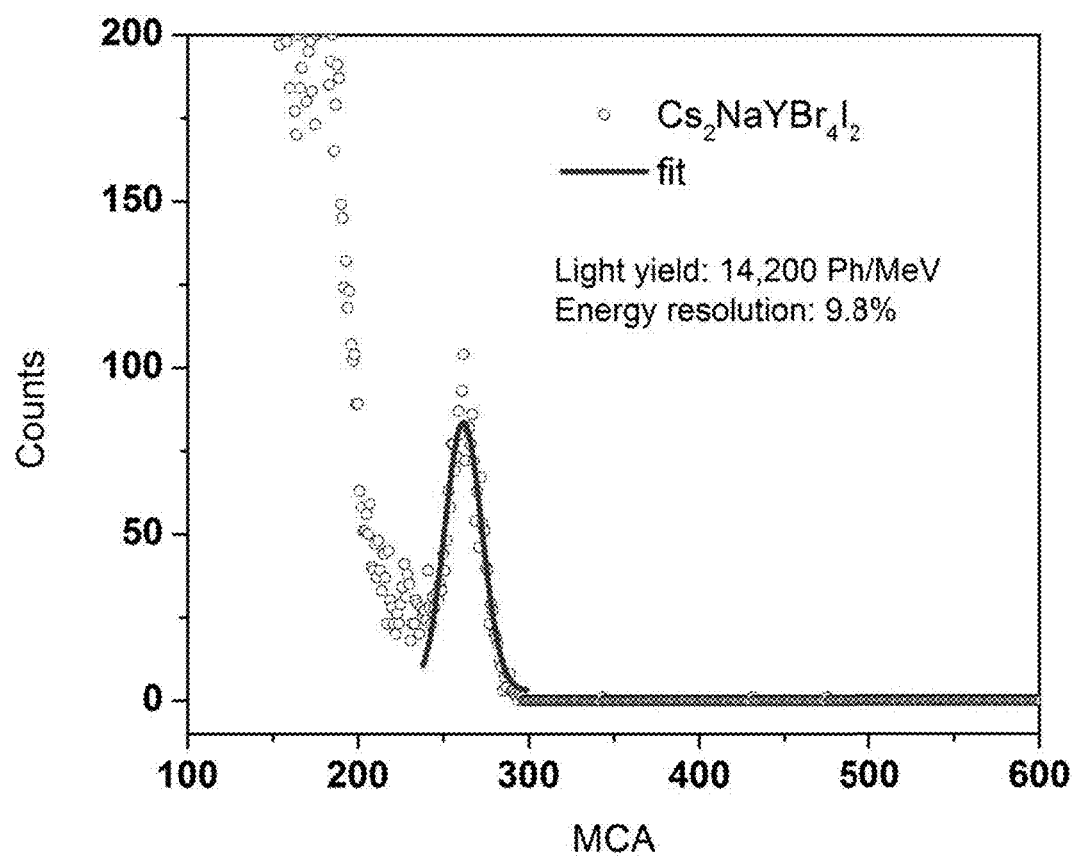
FIG. 4D illustrates the pulse height spectrum of an exemplary $Cs_2NaYBr_4I_2$ intrinsic scintillator.
Figure 4E:
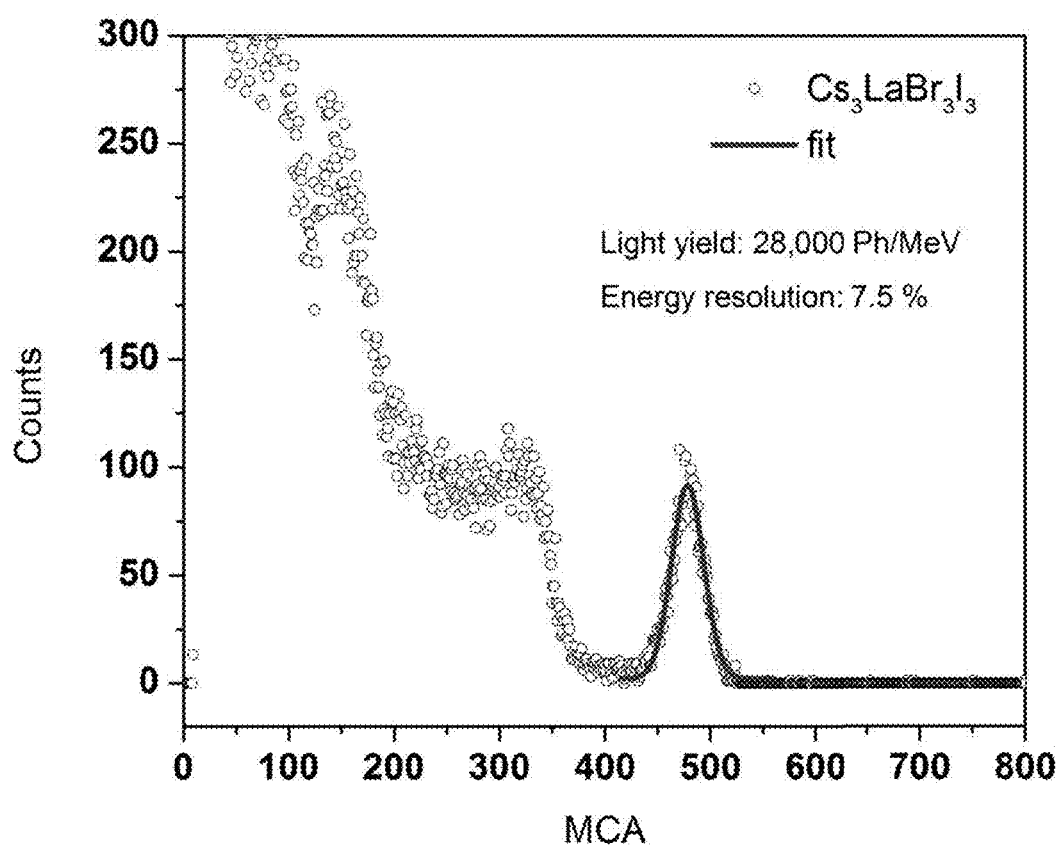
FIG. 4E illustrates the pulse height spectrum of an exemplary $Cs_3LaBr_3I_3$ intrinsic scintillator.
Figure 4F:
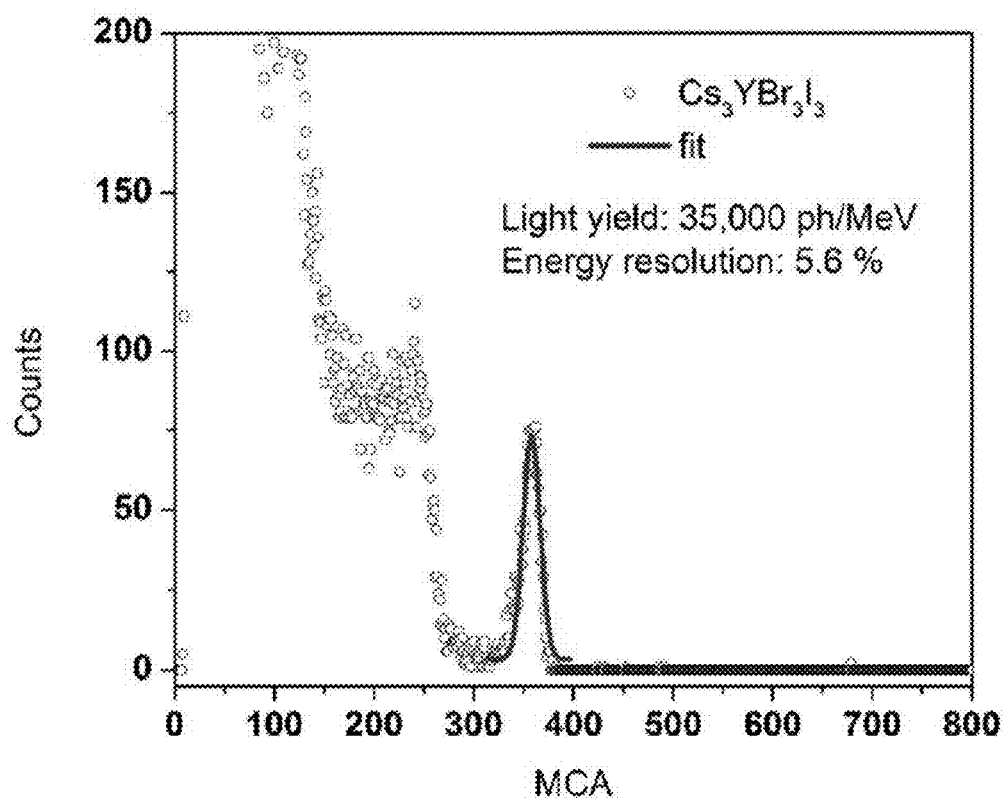
FIG. 4F illustrates the pulse height spectrum of an exemplary $Cs_3YBr_3I_3$ intrinsic scintillator.

In FIG. 4A, the pulse height spectrum of an exemplary $Cs_2NaLaBr_3I_3$ intrinsic scintillator with Cs-137 gamma ray source is shown, and exhibits a light yield of 34,000 ph/MeV and 9.1% energy resolution. FIG. 4B shows the pulse height spectrum of an exemplary $Cs_2NaYBr_3I_3$ intrinsic scintillator with Cs-137 gamma ray source is shown, which exhibits a light yield of 40,000 ph/MeV and 4.3% energy resolution. In FIG. 4C, the pulse height spectrum of an exemplary $Cs_2KLaBr_3I_3$ intrinsic scintillator with Cs-137 gamma ray source is shown, which exhibits a light yield of 32,000 ph/MeV and 6.2% energy resolution. FIG. 4D shows the pulse height spectrum of an exemplary $Cs_2NaYBr_4I_2$ intrinsic scintillator with Cs-137 gamma ray source, which exhibits a light yield of 14,200 ph/MeV and 9.8% energy resolution. In FIG. 4E, the pulse height spectrum of an exemplary $Cs_3LaBr_3I_3$ intrinsic scintillator with Cs-137 gamma ray source is shown, which exhibits a light yield of 28,000 ph/MeV and 7.5% energy resolution. FIG. 4F shows the pulse height spectrum of an exemplary $Cs_3YBr_3I_3$ intrinsic scintillator with Cs-137 gamma ray source, which exhibits a light yield of 35,000 ph/MeV and 5.6% energy resolution.

Scintillation Decay and Rise Time of Exemplary Intrinsic Scintillators

Scintillation decay time and rise time of exemplary intrinsic scintillators was measured at room temperature with the time correlated single photon counting technique, as described by Bollinger et al., "Measurement of the Time Dependence of Scintillation Intensity by a Delayed Coincidence Method," Review of Scientific Instruments, 1961, 32, 1044-1050, the disclosure of which are incorporated herein by reference. The irradiation source was Cs-137. All the scintillation decay curves were fit by double exponential decay functions, and the scintillation rise curves were fit by double exponential grow functions. FIGS. 5A to 5F below illustrate the decay curves of exemplary intrinsic scintillators, and FIGS. 6A and 6B illustrate rise curves of exemplary intrinsic scintillators.

Figure 5A:
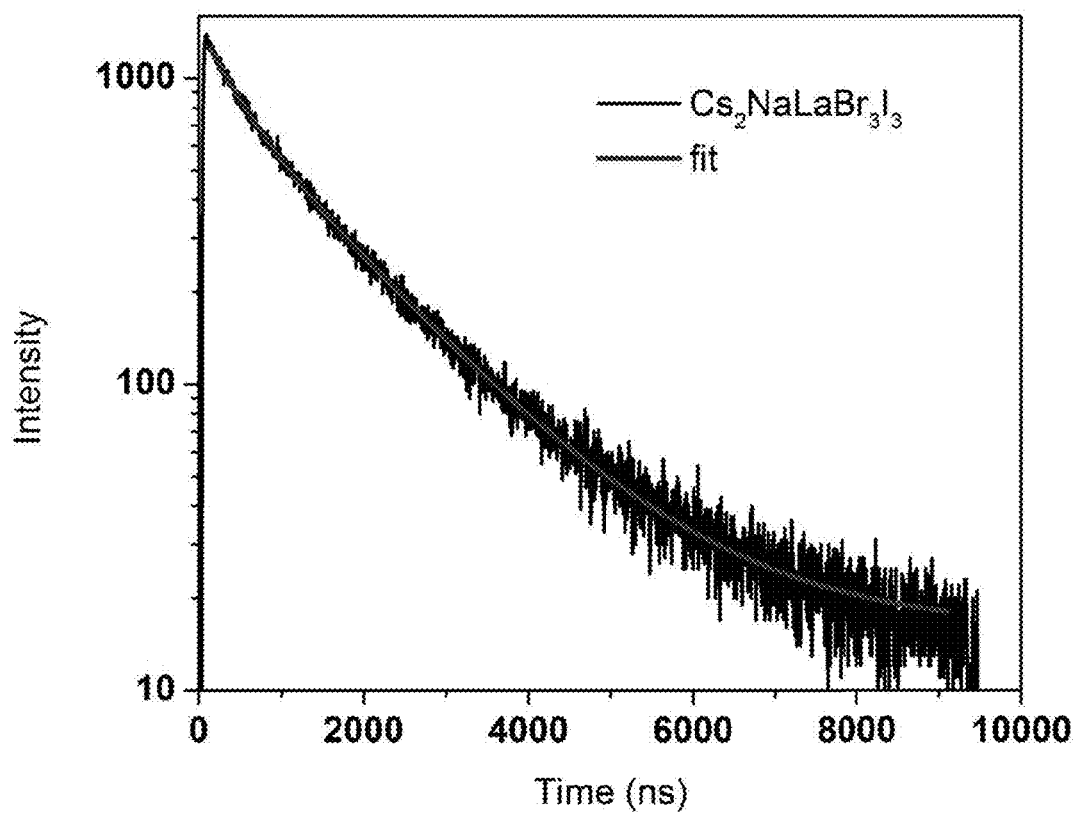
FIG. 5A illustrates the scintillation decay curve of an exemplary $Cs_2NaLaBr_3I_3$ intrinsic scintillator.
Figure 5B:
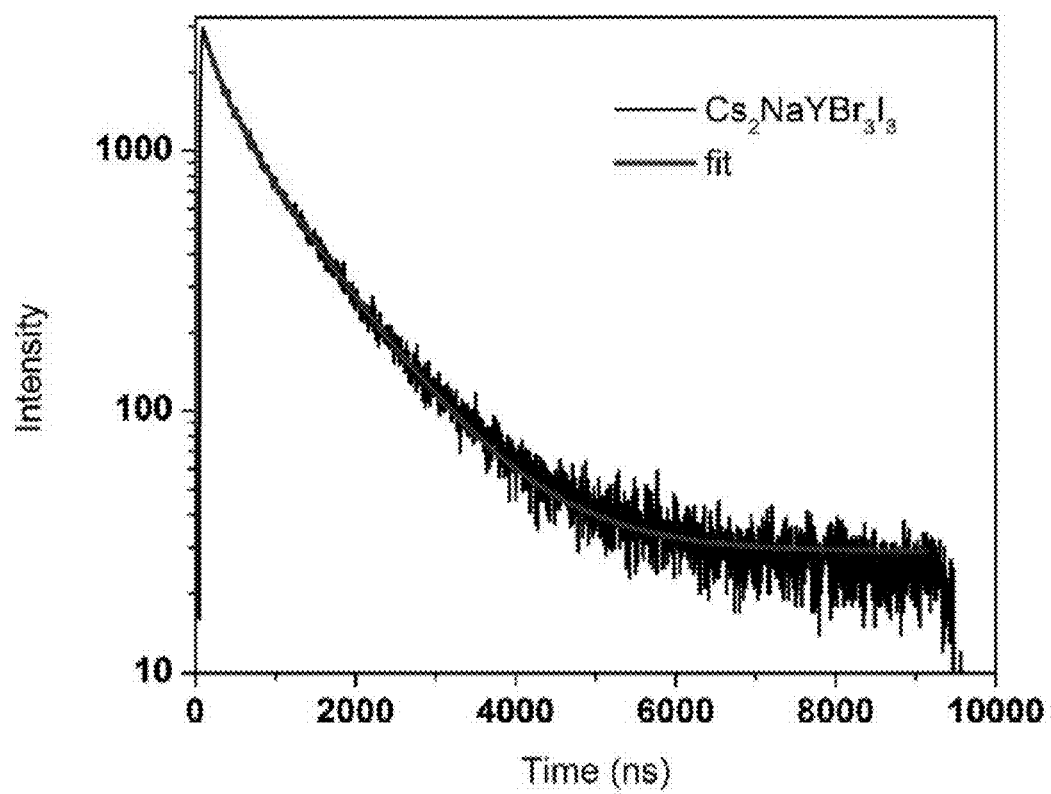
FIG. 5B illustrates the scintillation decay curve of an exemplary $Cs_2NaYBr_3I_3$ intrinsic scintillator.
Figure 5C:
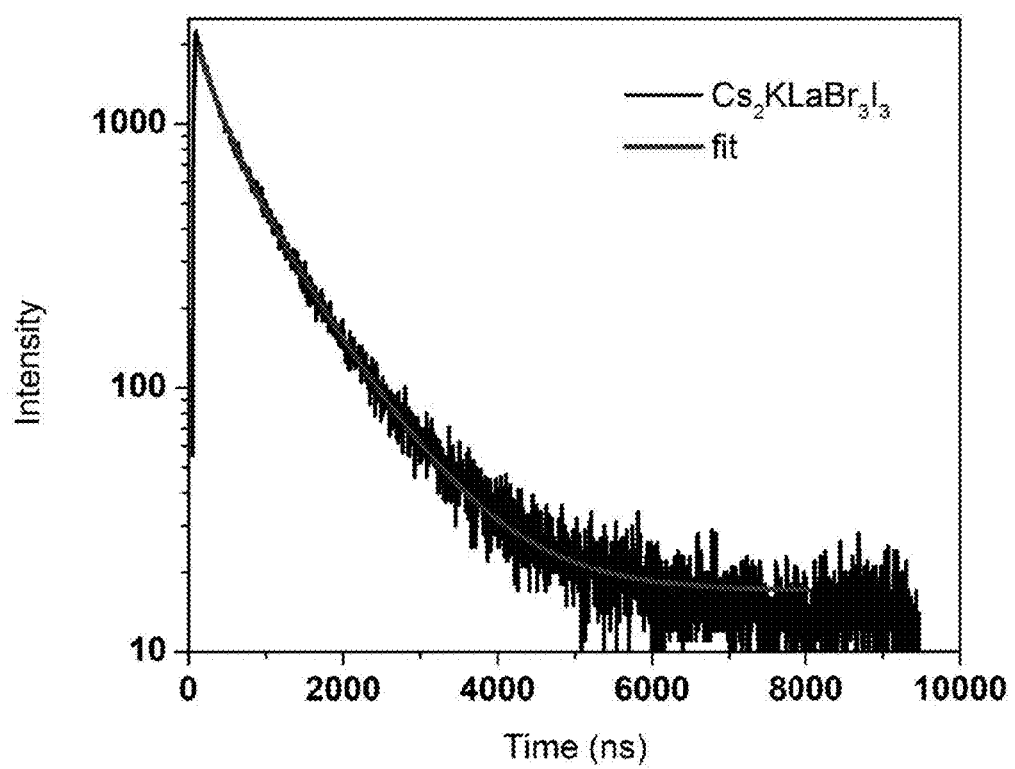
FIG. 5C illustrates the scintillation decay curve of an exemplary $Cs_2KLaBr_3I_3$ intrinsic scintillator.
Figure 5D:
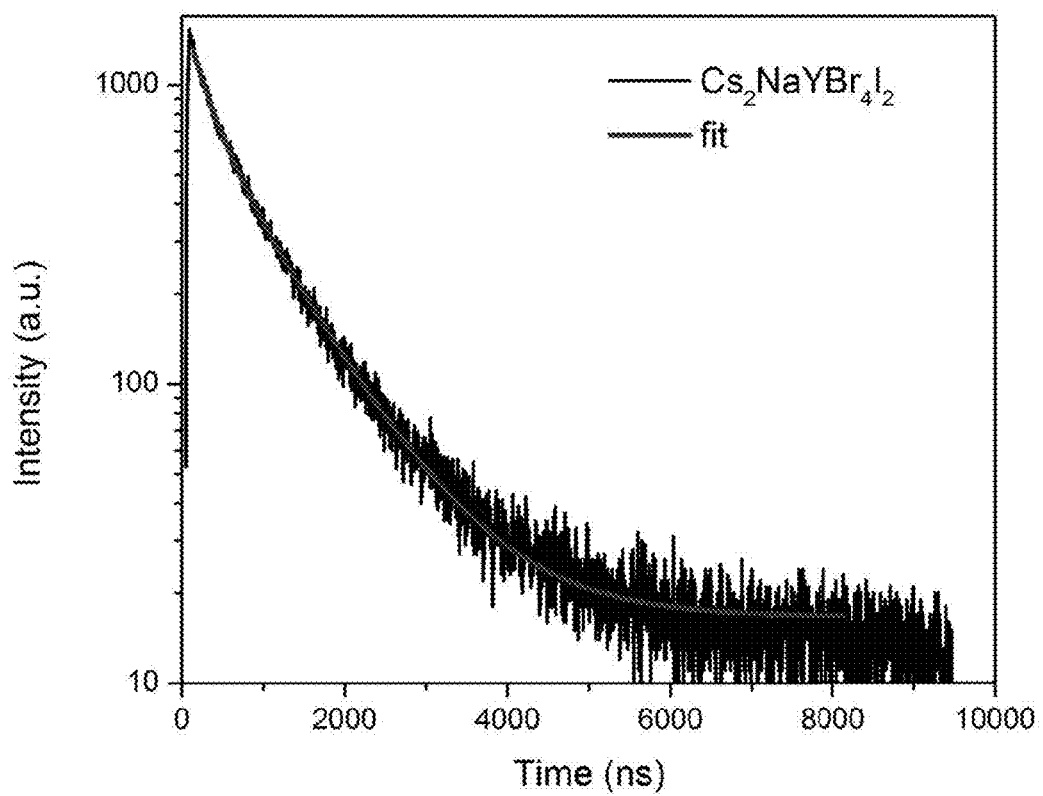
FIG. 5D illustrates the scintillation decay curve of an exemplary $Cs_2NaYBr_4I_2$ intrinsic scintillator.
Figure 5E:
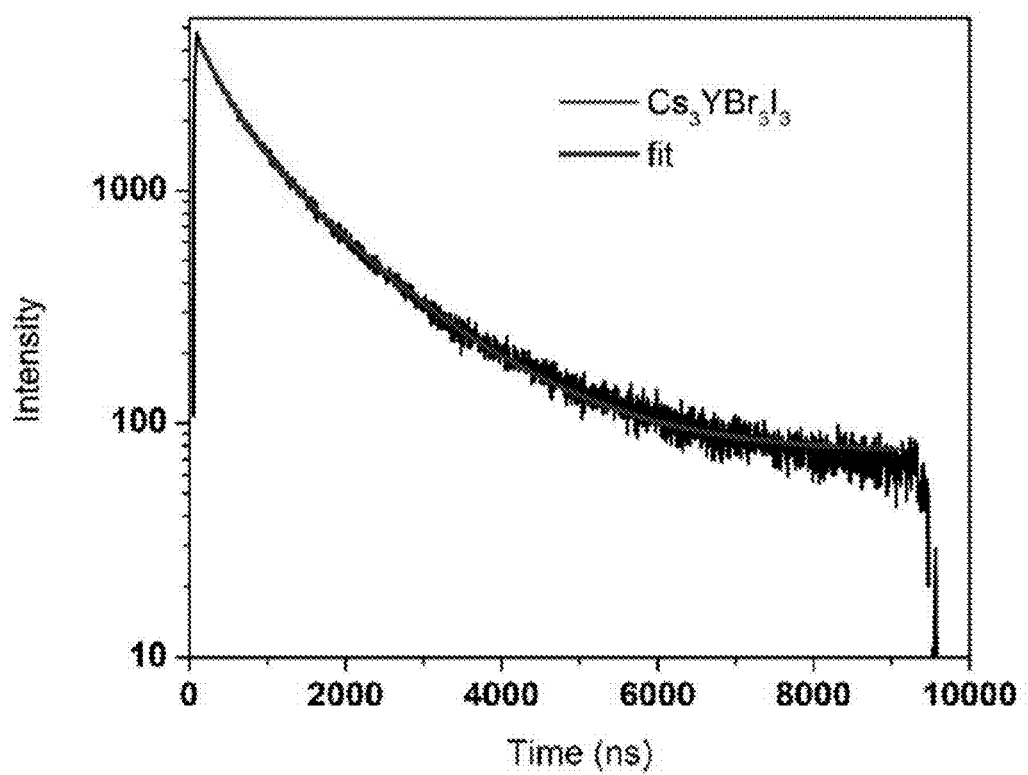
FIG. 5E illustrates the scintillation decay curve of an exemplary $Cs_3YBr_3I_3$ intrinsic scintillator.
Figure 5F:
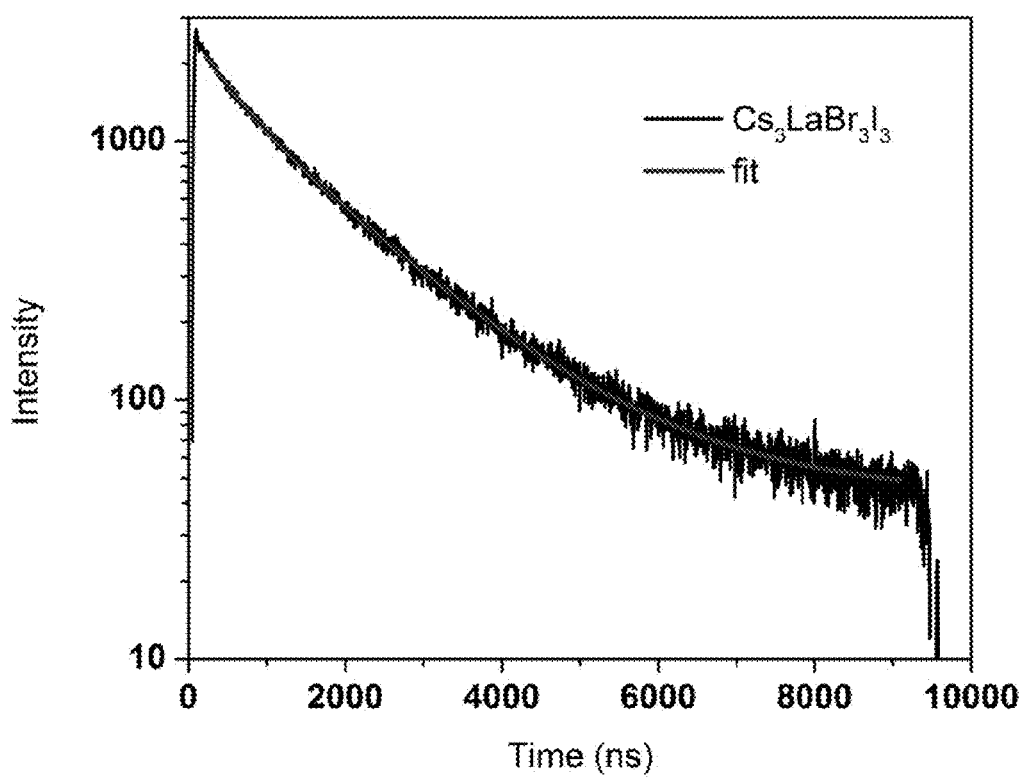
FIG. 5F illustrates the scintillation decay curve of an exemplary $Cs_3LaBr_3I_3$ intrinsic scintillator.

In FIG. 5A, the scintillation decay curve of an exemplary $Cs_2NaLaBr_3I_3$ intrinsic scintillator with Cs-137 source is illustrated. FIG. 5B shows the scintillation decay curve of an exemplary $Cs_2NaYBr_3I_3$ intrinsic scintillator with Cs-137 source. In FIG. 5C, the scintillation decay curve of an exemplary $Cs_2KLaBr_3I_3$ intrinsic scintillator with Cs-137 source is illustrated. FIG. 5D shows the scintillation decay curve of an exemplary $Cs_2NaYBr_4I_2$ intrinsic scintillator with Cs-137 source. In FIG. 5E, the scintillation decay curve of an exemplary $Cs_3YBr_3I_3$ intrinsic scintillator with Cs-137 source is illustrated. FIG. 5F shows the scintillation decay curve of an exemplary $Cs_3LaBr_3I_3$ intrinsic scintillator with Cs-137 source.

Figure 6A:
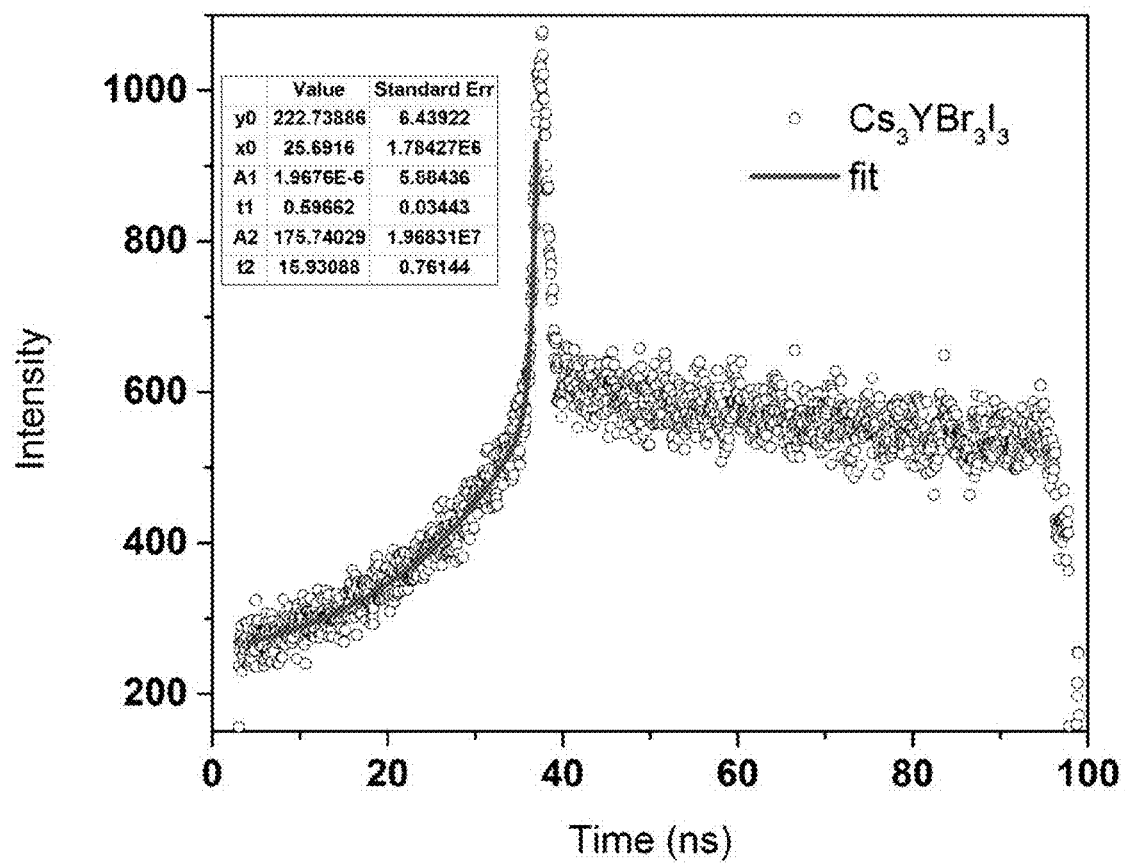
FIG. 6A illustrates the rise curve of an exemplary $Cs_3YBr_3I_3$ intrinsic scintillator.
Figure 6B:
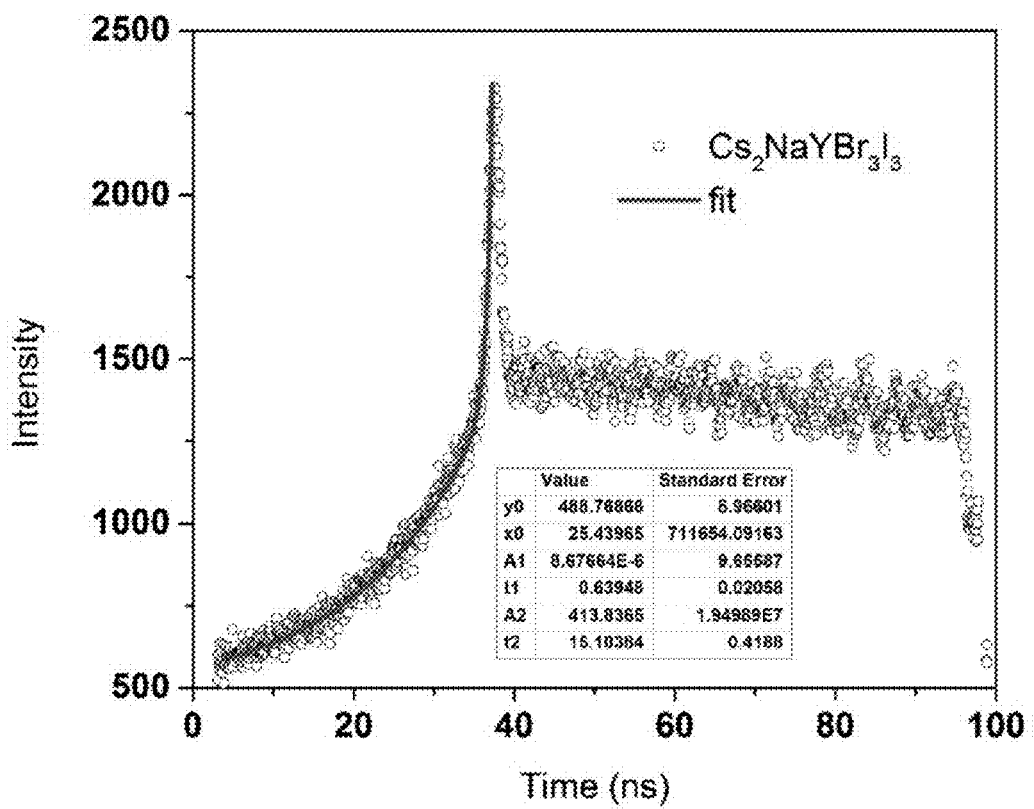
FIG. 6B illustrates the rise curve of an exemplary $Cs_2NaYBr_3I_3$ intrinsic scintillator.

In FIG. 6A, the scintillation rise time curve of an exemplary $Cs_3YBr_3I_3$ intrinsic scintillator, along with fit values for this curve, is shown. FIG. 6B illustrates the scintillation rise time curve of an exemplary $Cs_2NaYBr_3I_3$ intrinsic scintillator and fit values for this curve.

Comparison of Doped and Undoped Scintillators

The scintillation activity in the foregoing exemplary intrinsic scintillators was driven by STE, without the presence of external activators such as dopants. The radioluminescence spectra, photoluminescence spectra, photoluminescence decay, and scintillation light yield of two of the exemplary scintillators, $Cs_2NaLaBr_3I_3$ and $Cs_2NaYBr_3I_3$, when used as intrinsic scintillators and when used in the presence of $Ce^{3+}$ dopant, are discussed in the following paragraphs.

Single crystal intrinsic $Cs_2NaLaBr_3I_3$ and $Cs_2NaYBr_3I_3$ scintillators (the "intrinsic samples") and extrinsic $Cs_2NaLaBr_3I_3$:Ce and $Cs_2NaYBr_3I_3$:Ce scintillators (the "extrinsic samples") having various cerium concentration (by mole) were grown by the Bridgman method, as described by Wei et al., "Two new cerium-doped mixed-anion elpasolite scintillators: $Cs_2NaYBr_3I_3$ and $Cs_2NaLaBr_3I_3$," Optical Materials, vol. 38, pp. 154-160, December 2014, the disclosure of which is incorporated herein by reference. All the starting materials were 4N pure anhydrous materials from Sigma Aldrich. Iodide in the compound comes from CsI and NaI. In order to drive out the residual oxygen and moisture, the starting materials were baked under vacuum ($10^{-6}$ torr) at 250° C. before melting. Then the starting materials were melted and mixed by MAA mixing as described above and in Wei et al., "The scintillation properties of CeBr3-xClx single crystals," Journal of Luminescence, vol. 156, pp. 175-179, 12//2014 and Wei et al., "Temperature dependence spectroscopic study of Ce-doped Cs3LaCl6 and Cs3LaBr6 scintillators," Journal of Luminescence, vol. 160, pp. 64-70, 4//2015, and the disclosure of each of these publications is incorporated herein by reference. The synthesis temperature was 20° C. above the highest melting temperature of the starting material. Finally, the crystals were grown in a 24-zone electro-dynamic gradient furnace. The pulling rate was ~3 mm/h, and the cooling rate was 3-5° C./h. Single crystals of 8 mm to 15 mm in diameter were successfully harvested.

Inductively coupled plasma atomic emission spectroscopy (ICP-OES) with a detection limit of 1 ppm was used to detect the trace of $Ce^{3+}$ in all intrinsic crystals. No $Ce^{3+}$ was detected.

Radioluminescence Spectra

Radioluminescence spectra were recorded at room temperature by exciting the samples with X-rays from a CMX-003 X-ray generator. The target material is Cu. The voltage and current of the X-ray tube were 35 kV and 0.1 mA. The emission spectra were recorded with a 150 mm focal length monochromator (PI ACTON SpectraPro SP-2155m) over a wavelength range of 200 to 800 nm. Scintillation decay time was measured at room temperature with the time correlated single photon counting technique described by Bollinger et al. in "Measurement of the Time Dependence of Scintillation Intensity by a Delayed-Coincidence Method," *Review of Scientific Instruments*, vol. 32, p. 6, 1961. The measurement range is 10 µs, and the irradiation source was 137Cs. All the scintillation time curves were fitted by exponential decay functions.

Figure 7A:
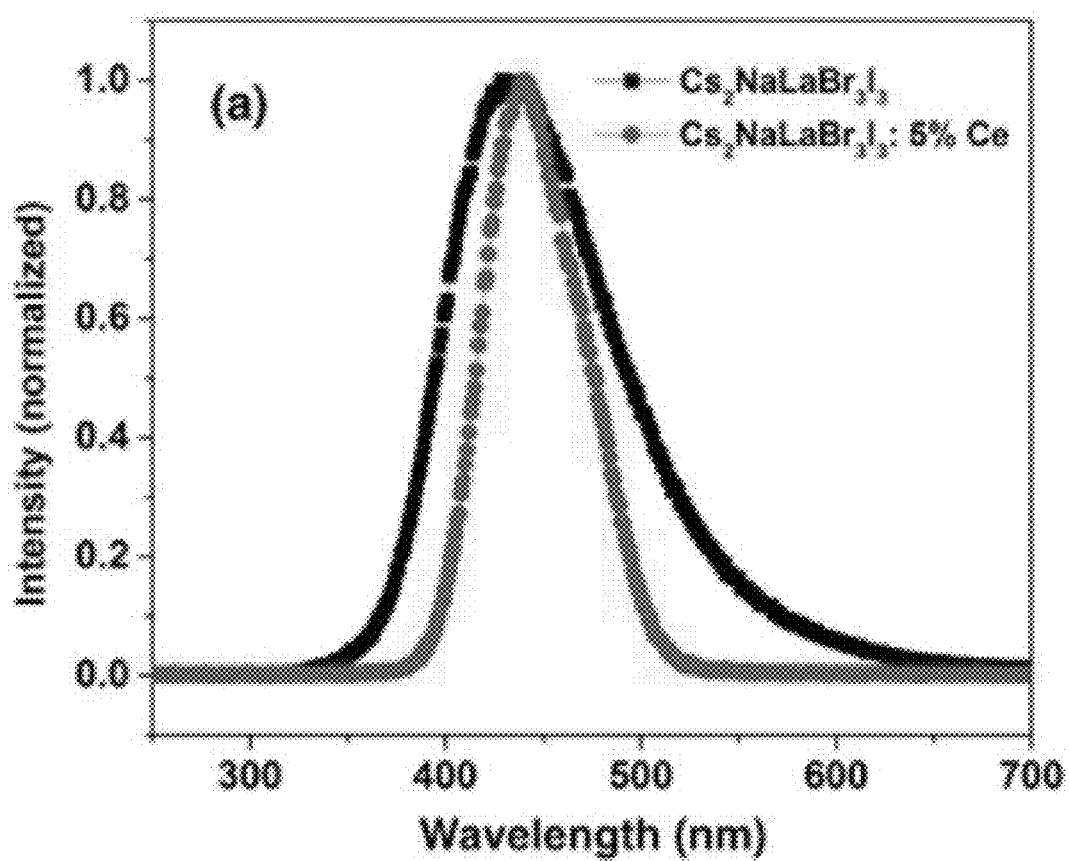
FIG. 7A illustrates radioluminescence emission spectra of exemplary $Cs_2NaLaBr_3I_3$ intrinsic and extrinsic scintillators.
Figure 7B:
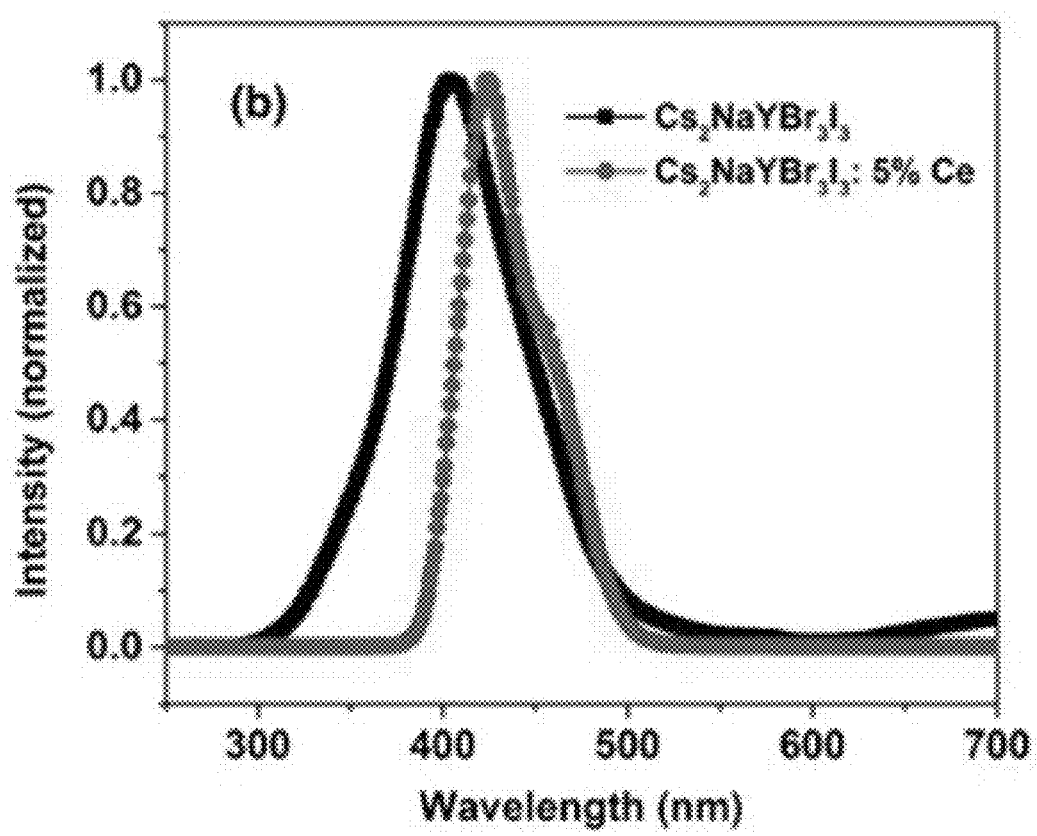
FIG. 7B illustrates radioluminescence emission spectra of exemplary $Cs_2NaYBr_3I_3$ intrinsic and extrinsic scintillators.

FIGS. 7A and 7B show a comparison of radioluminescence emission spectra between intrinsic and extrinsic $Cs_2NaLaBr_3I_3$ and $Cs_2NaYBr_3I_3$. As shown in these figures, the intrinsic samples have broader emission peak than the extrinsic samples. The emission peak of the extrinsic samples can be resolved into two Gaussian sub-peaks. This is due to the splitting of the $Ce^{3+}$ ground state $4f(^2F_{5/2})$ and $4f(^2F_{7/2})$. The splitting is more visible in $Cs_2NaYBr_3I_3$:Ce in FIG. 7B. The broad emission of the intrinsic samples is attributed to the STE emission.

Photoluminescence Spectra

Photoluminescence emission and excitation spectra were measured with a Horiba Jobin Yvon Fluorolog 3 Spectrofluorometer equipped with a 450 W Xe lamp. Horiba Jobin Yvon NanoLED light sources with various wavelengths were used for photoluminescence decay measurement, the pulse duration is less than 1 ns, and the repetition rate of the LED was set to 1 MHz. A Hamamatsu R928 PMT was used to record the emission as a function wavelength. The sample was protected in a vacuum-tight sample holder with transparent quartz window. A closed cycle compressed helium cryostat (Advanced Research Systems, DE-202) was used to cool and heat the sample from 40 K to 750 K under vacuum ($<10^{-3}$ torr).

Figure 8A:
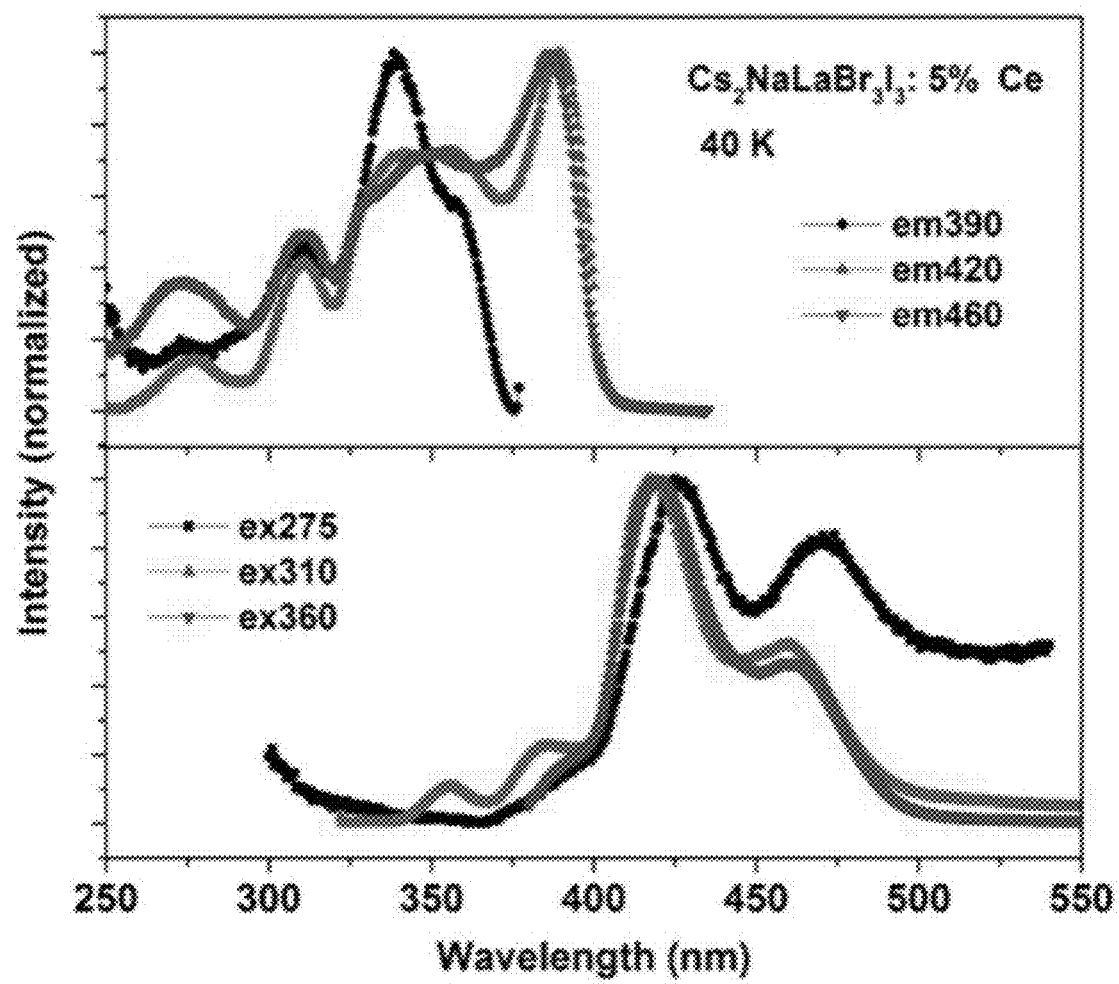
FIG. 8A illustrates the photoluminescence excitation and emission spectra of an exemplary $Cs_2NaLaBr_3I_3$:5% Ce scintillator.
Figure 8B:
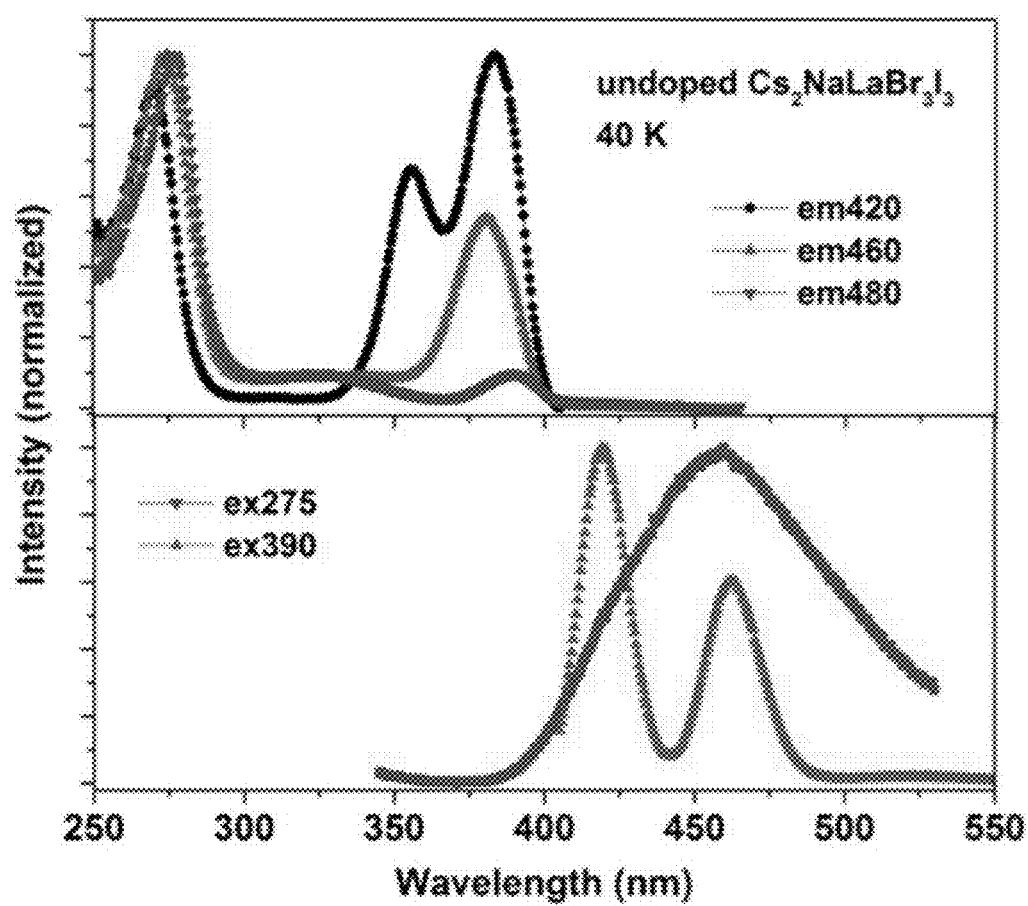
FIG. 8B illustrates the photoluminescence excitation and emission spectra of undoped exemplary $Cs_2NaLaBr_3I_3$ intrinsic scintillator.

FIG. 8A shows a comparison between the photoluminescence excitation (top) and photoluminescence emission (bottom) spectra of $Cs_2NaLaBr_3I_3$:5% Ce at 40 K. FIG. 8B shows a comparison between the photoluminescence excitation (top) and photoluminescence emission (bottom) spectra of intrinsic (undoped) $Cs_2NaLaBr_3I_3$ at 40 K. These spectra are normalized to the maximum peak. At 40 K, the splitting of Ce-5d levels is well resolved. In the photoluminescence spectra of both extrinsic and intrinsic $Cs_2NaLaBr_3I_3$, an isolated Gaussian shape excitation peak is observed from 250 nm (4.96 eV) to 280 (4.43 eV) nm. This excitation band is ascribed to exciton excitation band, in which the electrons and holes are created, while the electron is still bonded to the hole and forms an electron-hole pair. Therefore, the electron is not free to move and has not reached the conduction band. The exciton band can also be retrieved from the optical absorption/transmittance spectra, which is the onset of the fundamental absorption edge which has been verified in Wei et al., "Two new cerium-doped mixed-anion elpasolite scintillators: $Cs_2NaYBr_3I_3$ and $Cs_2NaLaBr_3I_3$," noted above. The broad excitation band from 310 nm to 405 nm can be assigned to the splitting of $Ce^{3+}$ 5d states.

In the emission spectra of the $Cs_2NaLaBr_3I_3$:5% Ce scintillator shown in FIG. 8A, the intense 420 nm and 460 nm emission peaks are attributed to the transition from $Ce^{3+}$ 5d state to the split ground state of $4f(^2F_{5/2})$ and $4f(^2F_{7/2})$. They are observed when the excitation falls in the $Ce^{3+}$ excitation band (~310-405 nm). However, when excited with 275 nm, the emission peak becomes broader with longer wavelength (black square curve), though the $Ce^{3+}$ 4f-splitting feature can still be seen. This emission can be assigned a combination of STE emission and $Ce^{3+}$ emission. In the intrinsic $Cs_2NaLaBr_3I_3$ scintillator shown in FIG. 8B, the $Ce^{3+}$ emission is also observed at 420 nm and 460 nm, which is likely due to the trace amount of Ce contamination in the sample, even though ICP-OES did not detect any $Ce^{3+}$ ions (detection limit: 1 ppm). When excited, the nominal intrinsic $Cs_2NaLaBr_3I_3$ scintillator at 275 nm, the emission is broad, and no resolved $Ce^{3+}$ emission is observed comparing with the extrinsic compound. This indicates the STE emission dominates in the intrinsic samples and can be suppressed with $Ce^{3+}$ appearance.

Figure 9A:
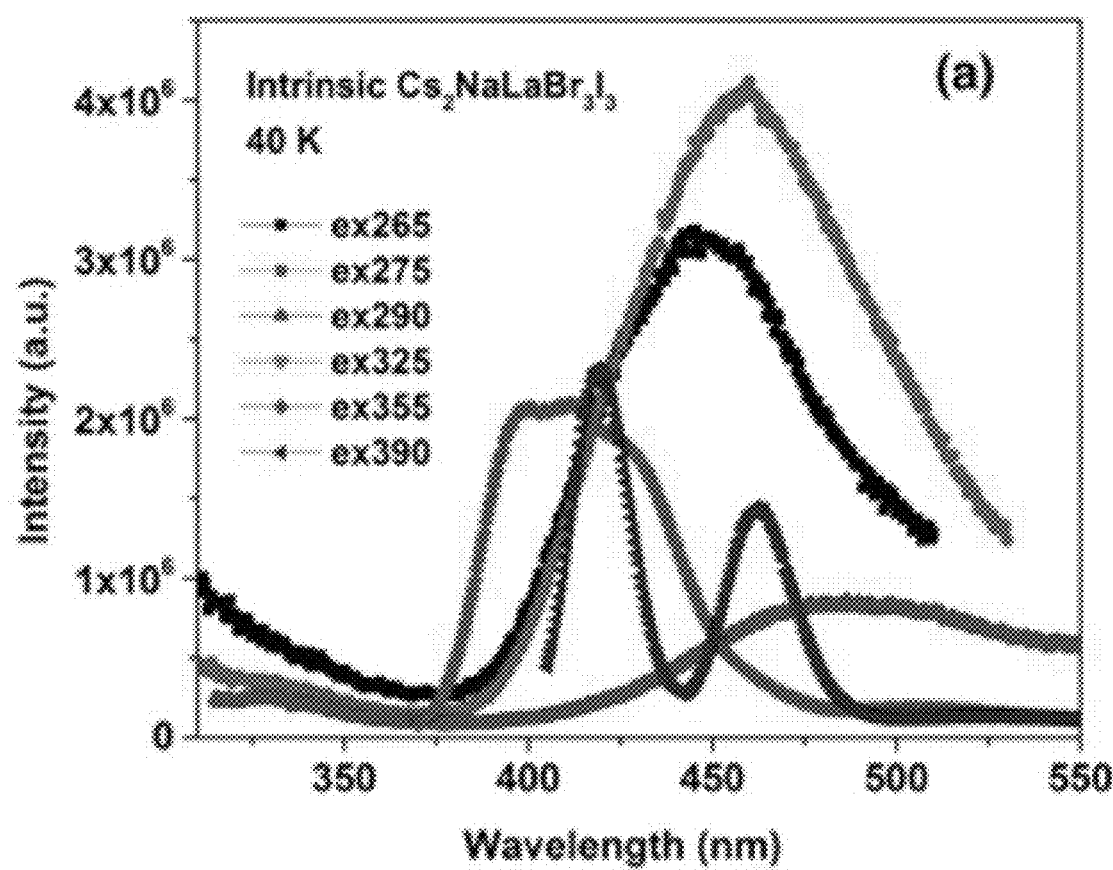
FIG. 9A illustrates the photoluminescence emission spectra of an exemplary $Cs_2NaLaBr_3I_3$ intrinsic scintillator.
Figure 9B:
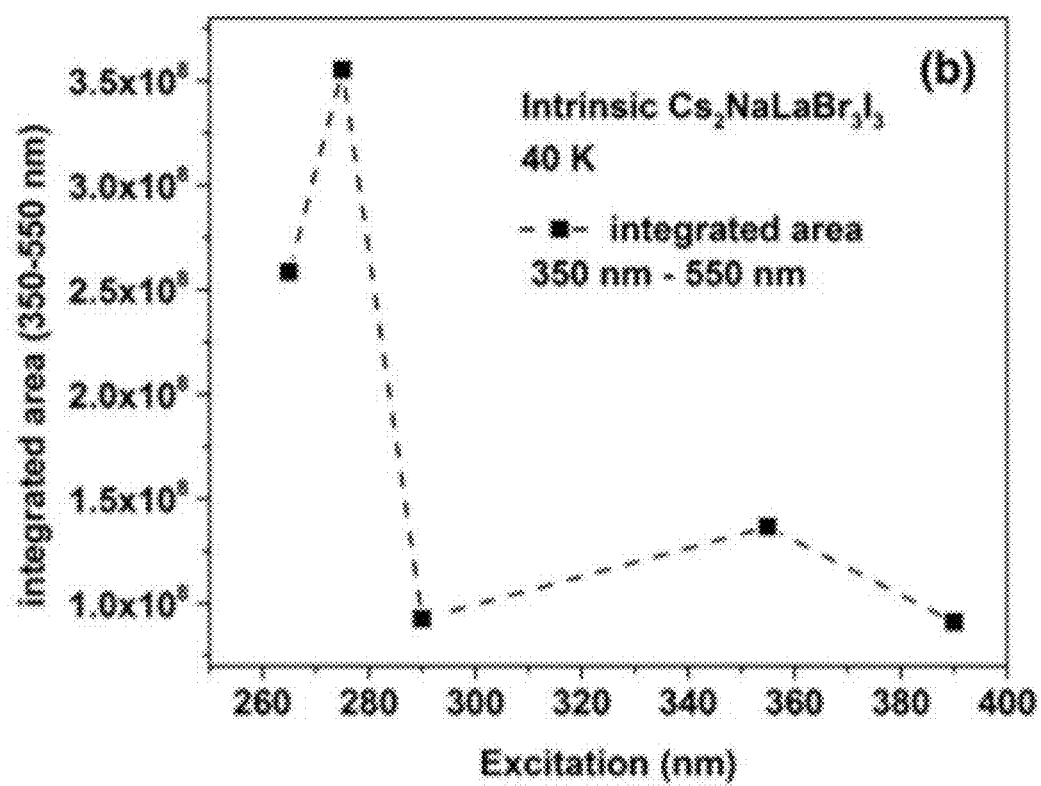
FIG. 9B illustrates the integrated intensity of an exemplary $Cs_2NaLaBr_3I_3$ intrinsic scintillator at varying wavelengths.

The photoluminescence emission spectra of intrinsic $Cs_2NaLaBr_3I_3$ and the integrated intensities at different excitation wavelengths are shown in FIGS. 9A and 9B. As shown in these figures, the emission intensity is much more intense when the excitation falls in the exciton excitation band, which also indicates the STE dominates in the intrinsic samples.

Figure 10A:
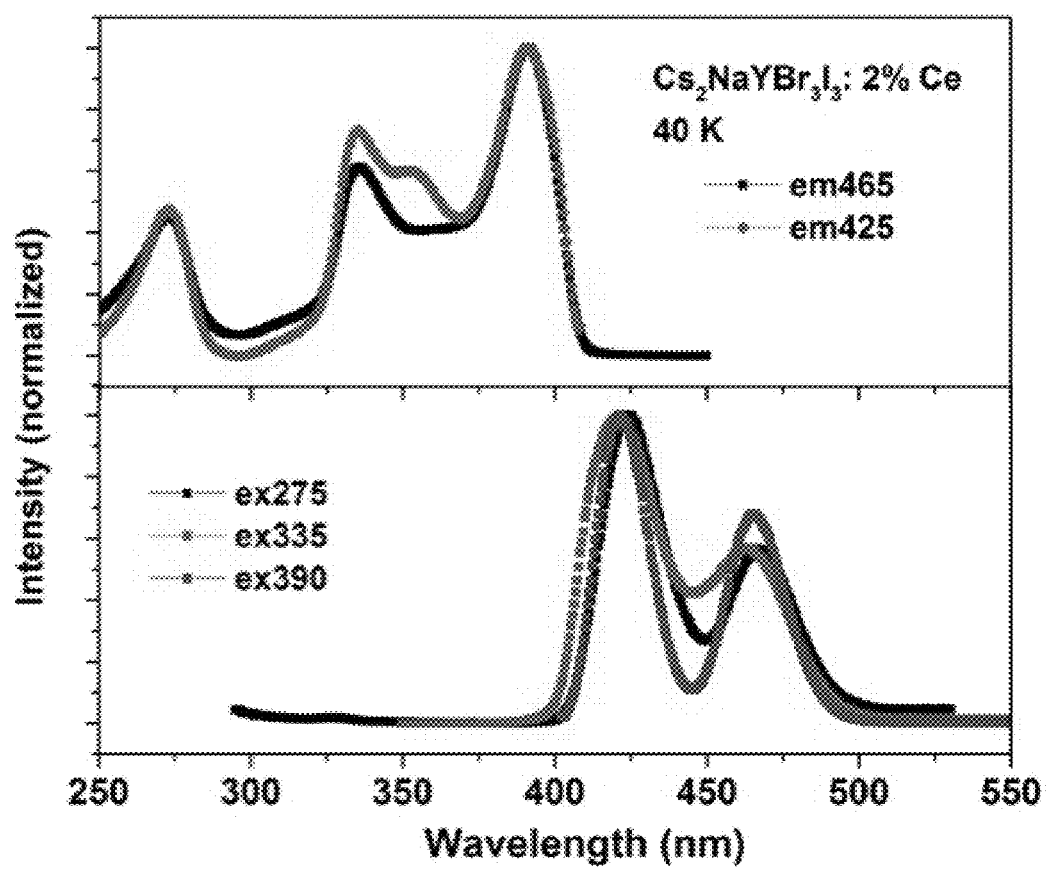
FIG. 10A illustrates the photoluminescence emission spectra of an exemplary $Cs_2NaYBr_3I_3$:2% Ce scintillator.
Figure 10B:
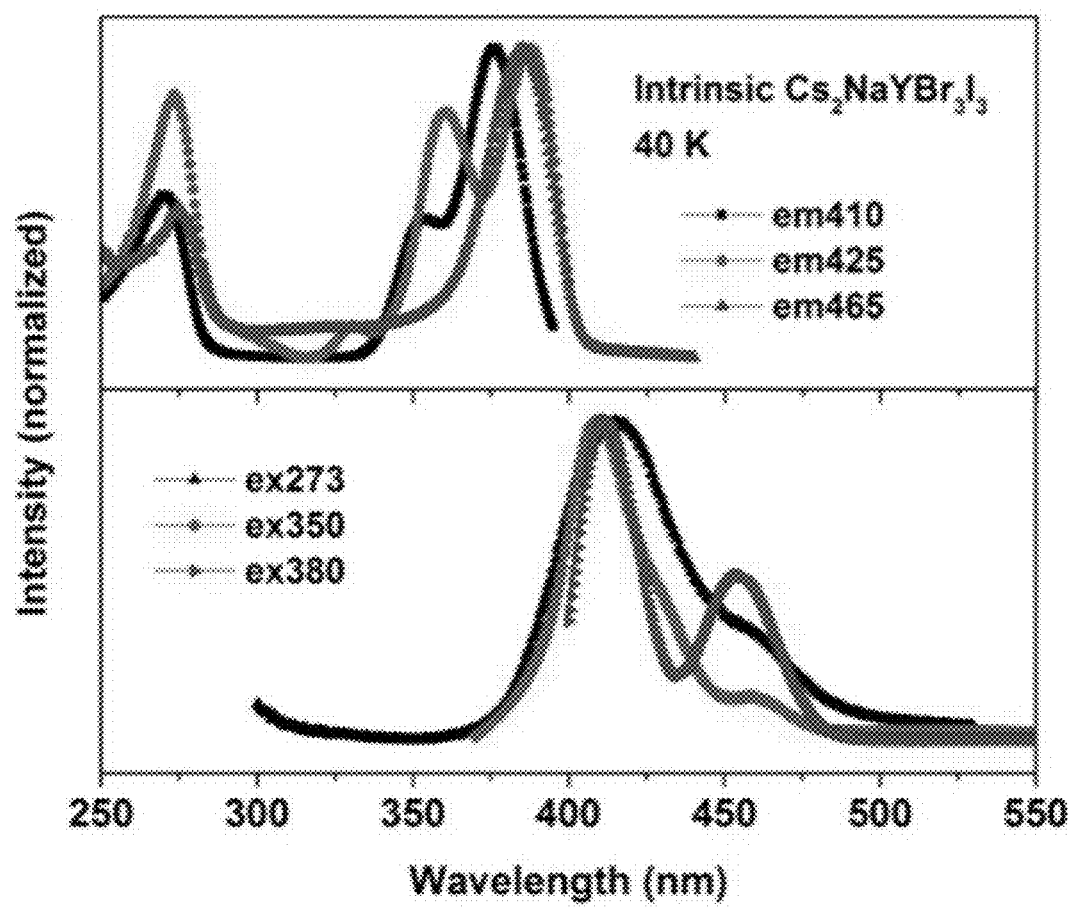
FIG. 10B illustrates the photoluminescence emission spectra of an exemplary $Cs_2NaYBr_3I_3$ intrinsic scintillator.
Figure 10C:
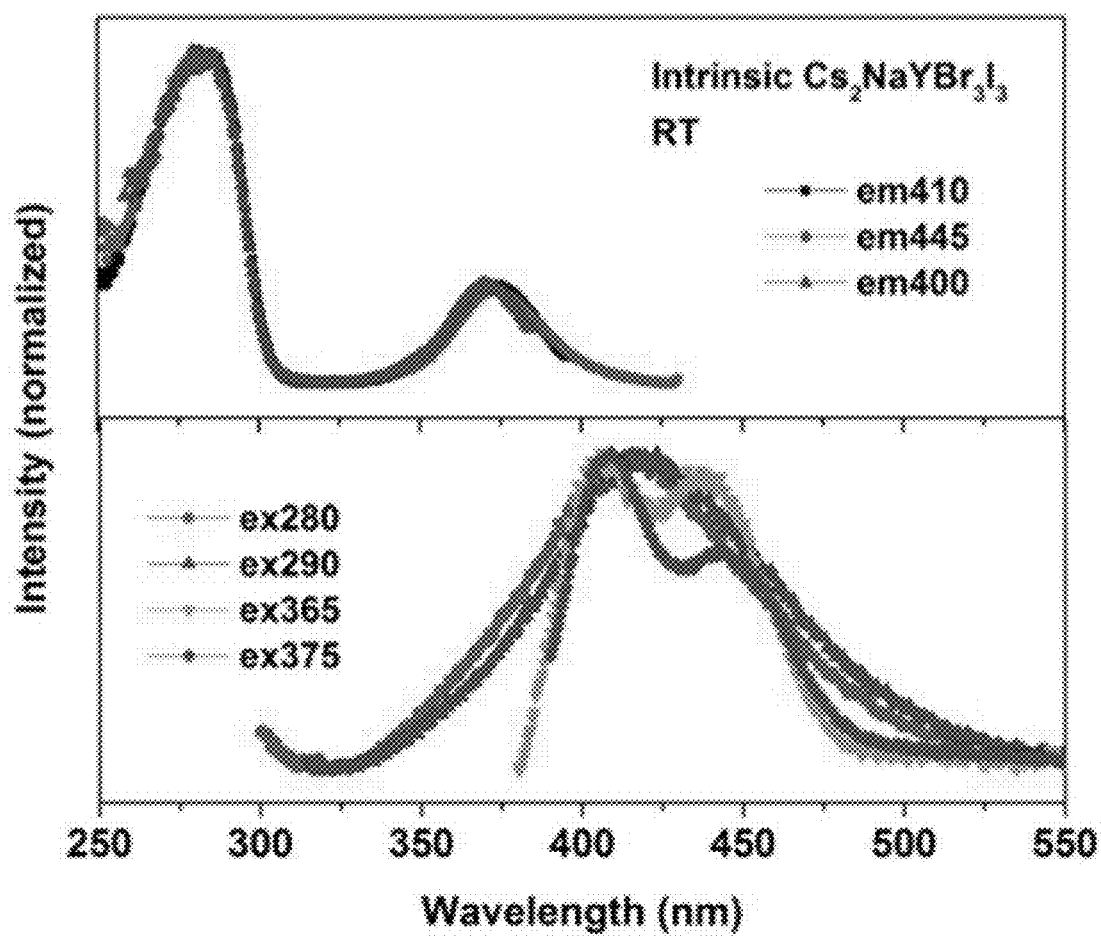
FIG. 10C illustrates the photoluminescence emission spectra of an exemplary $Cs_2NaYBr_3I_3$ intrinsic scintillator.

Similar behaviors were also observed in extrinsic and intrinsic $Cs_2NaYBr_3I_3$, as shown in FIGS. 10A and 10B. In the emission spectra of intrinsic $Cs_2NaYBr_3I_3$, when excited with 325 nm, a distinct broad long wavelength emission peak occurs (triangle curve in FIG. 10B). This could come from the trapped-excitons (TE) or defect related emissions. FIG. 10C shows the intrinsic $Cs_2NaYBr_3I_3$ photoluminescence spectra at room temperature for comparison. Unlike the 40 K excitation spectra, the short wavelength exciton excitation band (250-280 nm) is enhanced with elevated temperature compared with $Ce^{3+}$ excitation band (330-410 nm). Based on the emission spectra in FIG. 10C, the STE-induced broad emission from 320 nm to 550 nm has not yet quenched at room temperature. On the other hand, the $Ce^{3+}$ excitation band and the broad STE emission peak overlap and can result in radiative transfer from STE to $Ce^{3+}$, i.e., the STE emission can be re-absorbed, and the electrons and holes recombine at the $Ce^{3+}$ site and emit photons.

Photoluminescence Decay

Photoluminescence decay time of both extrinsic and intrinsic $Cs_2NaLaBr_3I_3$ and $Cs_2NaYBr_3I_3$ scintillators were recorded. For the extrinsic $Cs_2NaLaBr_3I_3$ and $Cs_2NaYBr_3I_3$ scintillators, the exciton excitation wavelengths of 295 nm, and the $Ce^{3+}$ excitation wavelength of 370 nm were chosen, in order to monitor the emissions from STE and $Ce^{3+}$, respectively. As shown in the photoluminescence spectra in FIGS. 9A and 10B, the STE and $Ce^{3+}$ emission have broad overlap between 320 nm and 550 nm, therefore the emission of 420 nm was monitored. The emission is too weak to observe using an airtight sample holder on the cryogenic station for low temperature measurement when intrinsic $Cs_2NaLaBr_3I_3$ and $Cs_2NaYBr_3I_3$ are excited with 295 nm. Instead, the room temperature photoluminescence decay curves are shown to illustrate the kinetics of exciton-excitation induced emission. The instrumental response decay curve is also plotted for reference.

Figure 11A:
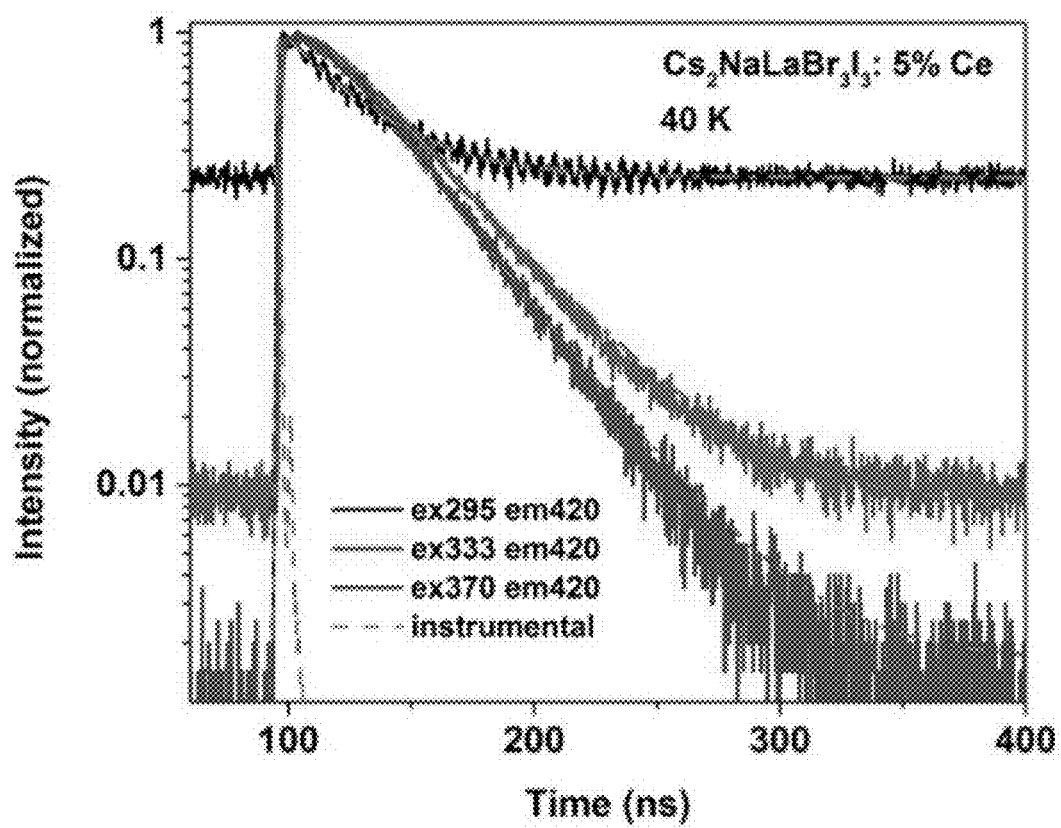
FIG. 11A illustrates the photoluminescence decay time of an exemplary $Cs_2NaLaBr_3I_3$:5% Ce scintillator.
Figure 11B:
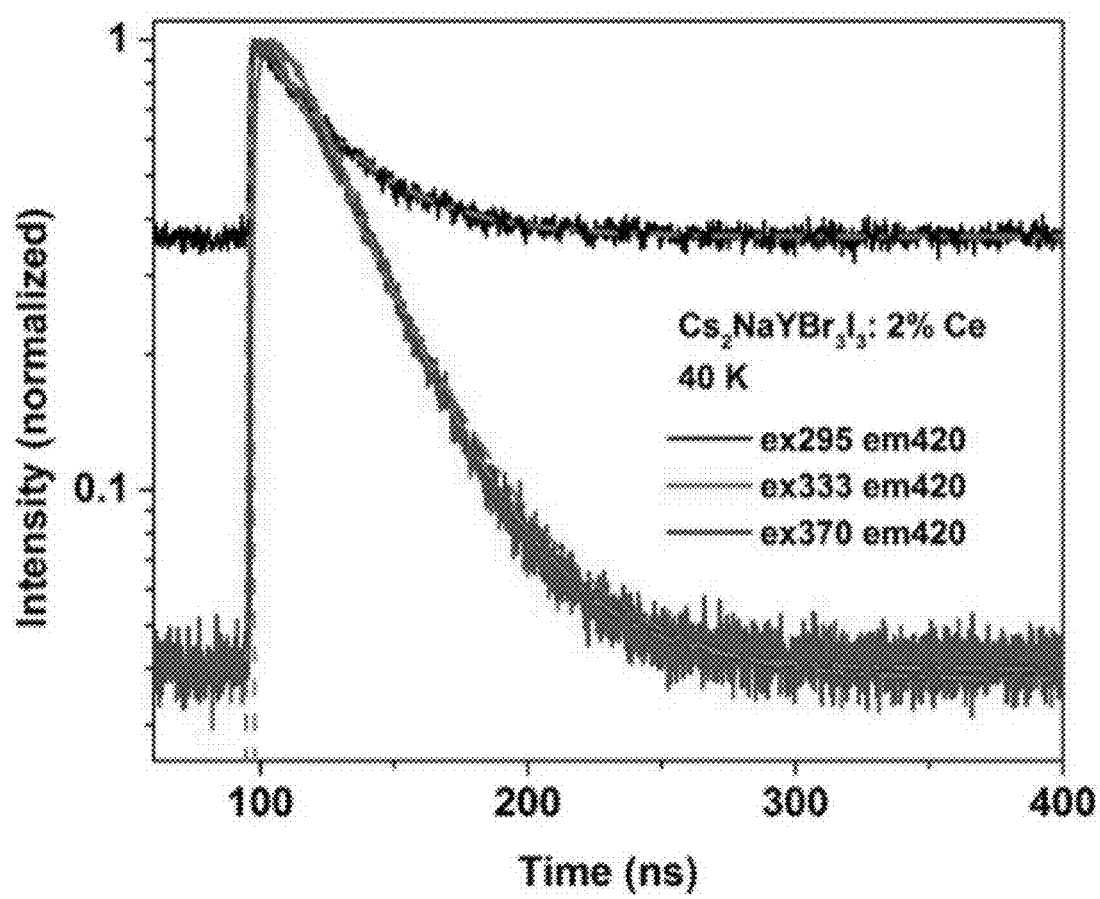
FIG. 11B illustrates the photoluminescence decay time of an exemplary $Cs_2NaYBr_3I_3$:2% Ce scintillator.

As shown in FIGS. 11A and 11B, the photoluminescence decay time is around 30 ns for extrinsic $Cs_2NaLaBr_3I_3$ and $Cs_2NaYBr_3I_3$ scintillators at 40 K, when excited with 333 nm and 370 nm. Both of the excitation wavelengths belong to the $Ce^{3+}$ excitation band, therefore, the photoluminescence decay can be ascribed to the $Ce^{3+}$ characteristic 5d-4f transition. When excited with 295 nm, which falls into the exciton excitation band, the photoluminescence decay monitored at 420 nm is also around 30 ns. It is clearly seen that the 295 nm-excited emission is much nosier than the 370 nm-excited emission, which indicates direct excitation at $Ce^{3+}$ excitation band is preferred over STE excitation in the extrinsic samples. In contrast, the photoluminescence decay of intrinsic samples behaves quite differently from extrinsic samples. When excited with 370 nm and monitored at 420 nm, both $Cs_2NaLaBr_3I_3$ and $Cs_2NaYBr_3I_3$ show the characteristic fast $Ce^{3+}$ decay of 30 ns due to the trace amount of $Ce^{3+}$. When monitored, the 420 nm emission with 295 nm excitation, which belongs to the exciton-excitation band, the long decay time above 1 μs is observed, which is readily ascribed to the STE decay.

Scintillation Decay

For the mixed elpasolites, the $Ce^{3+}$ has a fast photoluminescence decay time of around 30 ns, while the STE has a longer decay time above 1 μs. Because of the domination of $Ce^{3+}$ only in the intrinsic sample emission, the STE decay can be recorded distinctively. This is evidence that there is competition between STE and $Ce^{3+}$ in the scintillation process: 1) the STE transfers its energy to $Ce^{3+}$ radiatively, which means $Ce^{3+}$ is re-absorbing the emission from STE, and the decay time of $Ce^{3+}$ emission should be equivalent to the decay time of STE; and 2) the STE transfers its energy to $Ce^{3+}$ non-radiatively by thermal activated diffusion. Thus, an increase of $Ce^{3+}$ emission is expected as temperature increases.

Figure 12A:
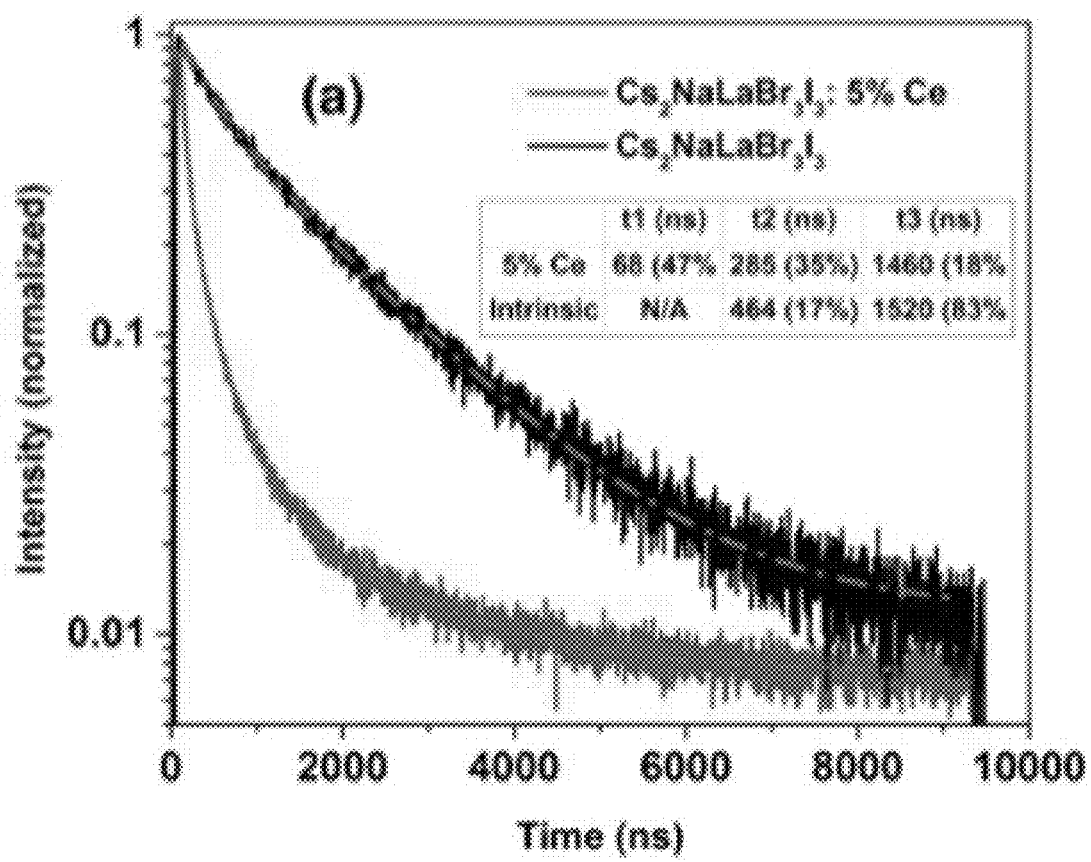
FIG. 12A illustrates the scintillation decay of an exemplary $Cs_2NaLaBr_3I_3$:5% Ce scintillator and an exemplary $Cs_2NaLaBr_3I_3$ intrinsic scintillator.
Figure 12B:
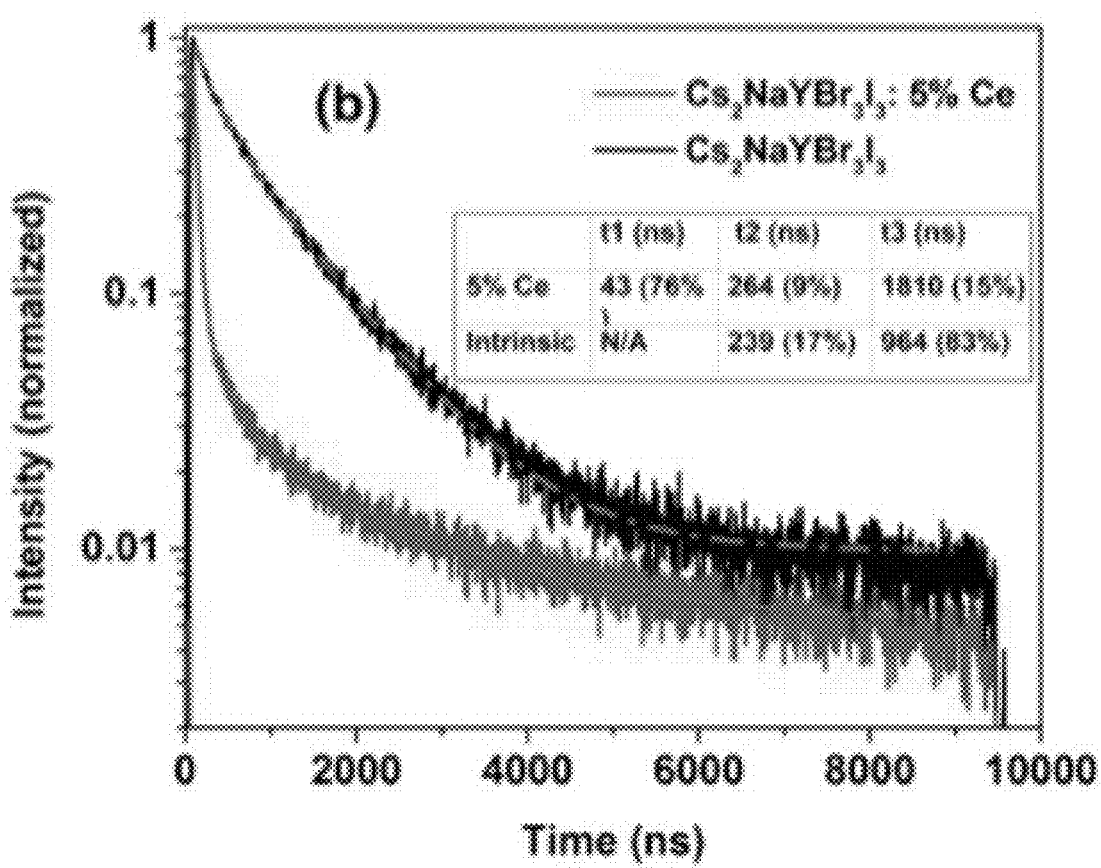
FIG. 12B illustrates the scintillation decay of an exemplary $Cs_2NaYBr_3I_3$:5% Ce scintillator and an exemplary $Cs_2NaYBr_3I_3$ intrinsic scintillator.

FIGS. 12A and 12B compare the scintillation decay between intrinsic and extrinsic samples at room temperature. The decay curves of extrinsic and intrinsic $Cs_2NaLaBr_3I_3$ and $Cs_2NaYBr_3I_3$ were fitted with three and two exponential decay functions, respectively. The decay time and the ratio are shown in the inset tables. The fast decay component below 100 ns is a characteristic of $Ce^{3+}$ de-excitation process, and it is the major contribution in both extrinsic $Cs_2NaLaBr_3I_3$ and $Cs_2NaYBr_3I_3$ scintillators. It is clearly seen that the fast decay component is absent in the intrinsic samples. Instead, the slow decay component around 1 μs contributes to more than 80% of the total emission in the intrinsic samples.

Scintillation Light Yield

Scintillation light yield was measured by coupling a sample to a Hamamatsu R6321-100 photomultiplier tube to record the pulse height spectra (137Cs source). A Spectralon hemispherical dome was used to reflect the scintillation light into the PMT. The sample was put into a quartz vial filled with mineral oil, which was used to protect the sample from moisture. The total light loss due to the vial was ~10%. A Canberra 2005 pre-amp and an Ortec 672 amplifier with a shaping time of 10 μs amplified the photomultiplier tube signal. A multiple channel analyzer (Tukan 8K) was used to histogram the pulses, as described in Wei et al., "Effect of Ba substitution in $CsSrI_3:Eu^{2+}$," *Journal of Crystal Growth*, vol. 384, pp. 27-32, Dec. 1, 2013.

Figure 13A:
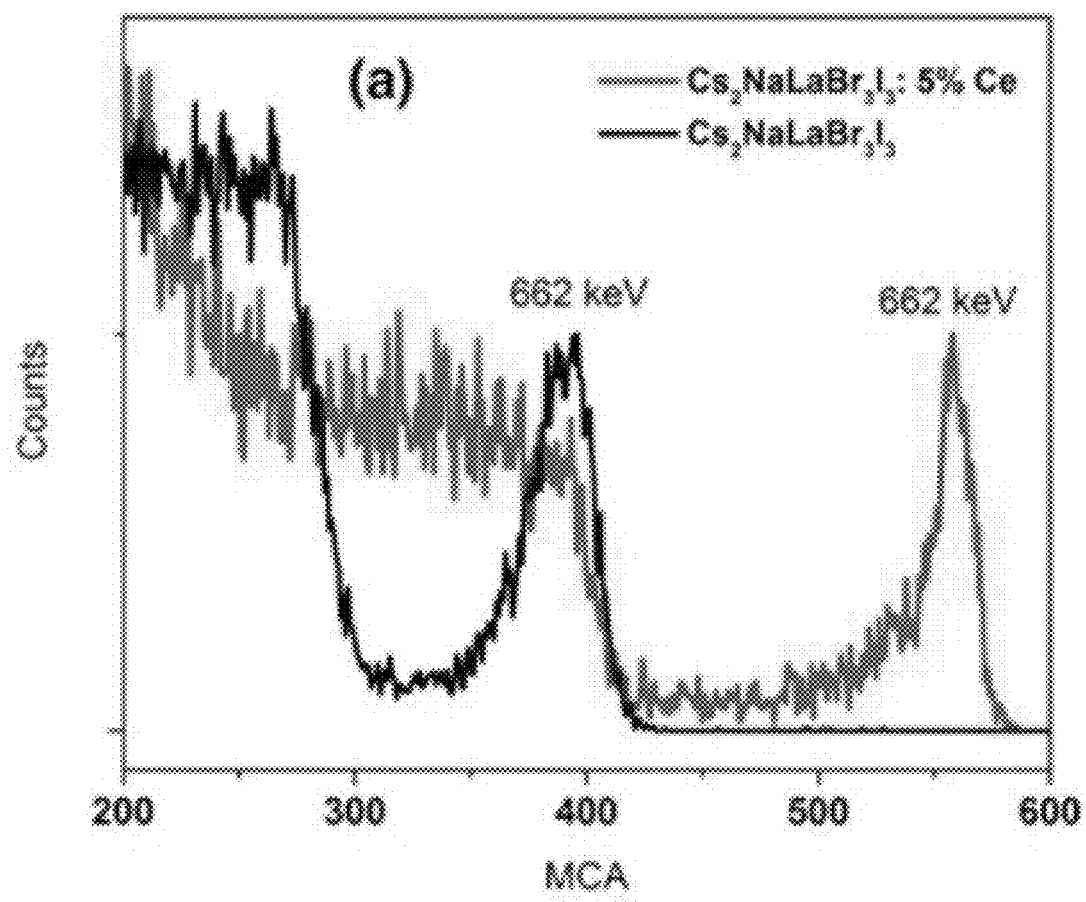
FIG. 13A illustrates the pulse height spectra of an exemplary $Cs_2NaLaBr_3I_3$:5% Ce scintillator and an exemplary $Cs_2NaLaBr_3I_3$ intrinsic scintillator.
Figure 13B:
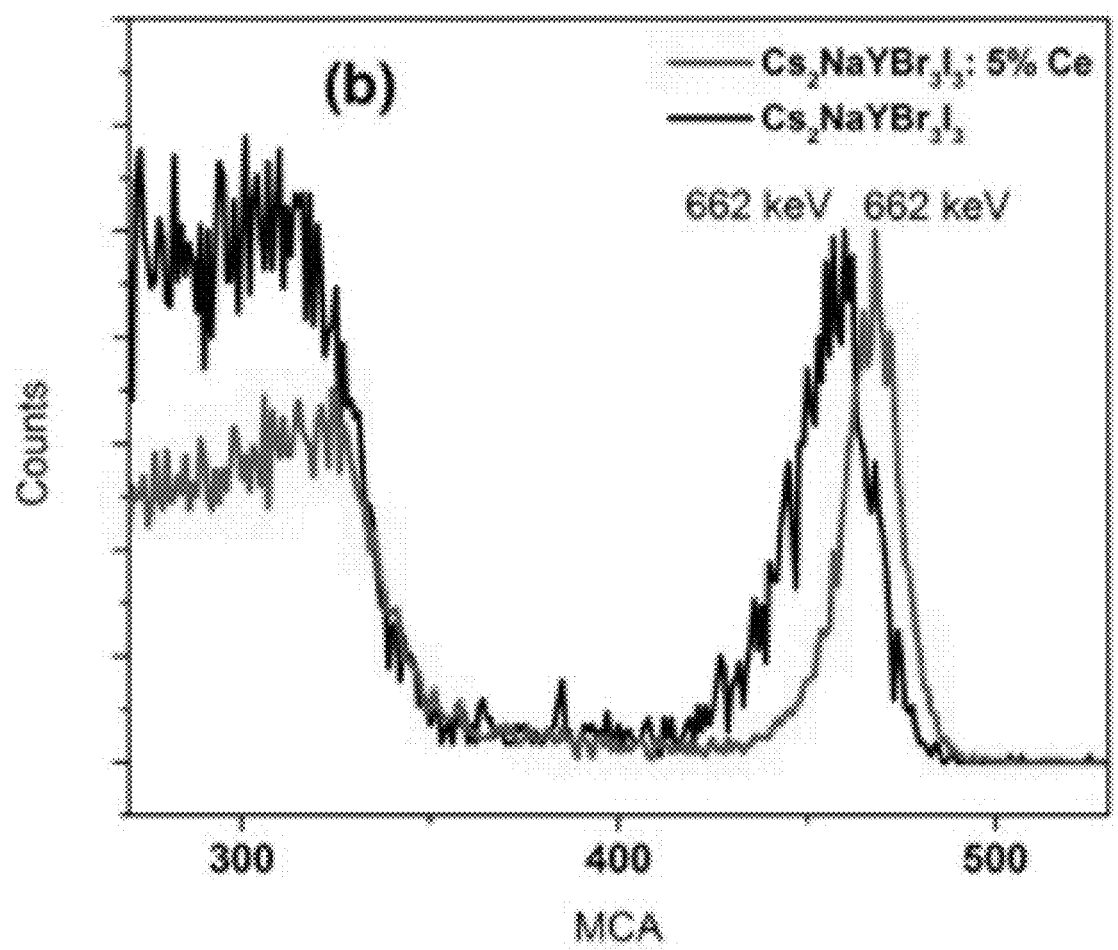
FIG. 13B illustrates the pulse height spectra of an exemplary $Cs_2NaYBr_3I_3$:5% Ce scintillator and an exemplary $Cs_2NaYBr_3I_3$ intrinsic scintillator.

The pulse height spectra of both intrinsic and extrinsic $Cs_2NaLaBr_3I_3$ and $Cs_2NaYBr_3I_3$ scintillators are shown in FIGS. 13A and 13B, respectively, using a Cs-137 source. The data in these figures was normalized to the 662 keV full-energy peaks. For the extrinsic sample, the Ce concentration was optimized for best energy resolution at 662 keV as described in Wei et al., "Two new cerium-doped mixed-anion elpasolite scintillators: $Cs_2NaYBr_3I_3$ and $Cs_2NaLaBr_3I_3$." Table III is a list of the light yield and energy resolution at selected exemplary samples.

TABLE III

Light Yield and Energy Resolution Comparison

| | Light Yield (ph/MeV) | Energy Resolution (662 keV) |
|---|---|---|
| Intrinsic $Cs_2NaLaBr_3I_3$ | 39,000 | 6.6% |
| $Cs_2NaLaBr_3I_3$: 5% Ce | 58,000 | 2.9% |
| Intrinsic $Cs_2NaYBr_3I_3$ | 40,000 | 4.3% |
| $Cs_2NaYBr_3I_3$: 2% Ce | 43,000 | 3.3% |

The intrinsic samples have less light yield than extrinsic samples, however, light yield of the intrinsic samples is more than many other well-known extrinsic scintillators, such as LSO:Ce, as reported by Melcher et al. in "Cerium-doped lutetium oxyorthosilicate: a fast, efficient new scintillator," *IEEE Transactions on Nuclear Science*, vol. 39, pp. 502-505, 1992, and YAP:Ce, as reported by Moszynski et al., "Properties of the YAP:Ce scintillator," *Nuclear Instruments & Methods in Physics Research Section a-Accelerators Spectrometers Detectors and Associated Equipment*, vol. 404, pp. 157-165, Feb. 11, 1998.

Figure 14:
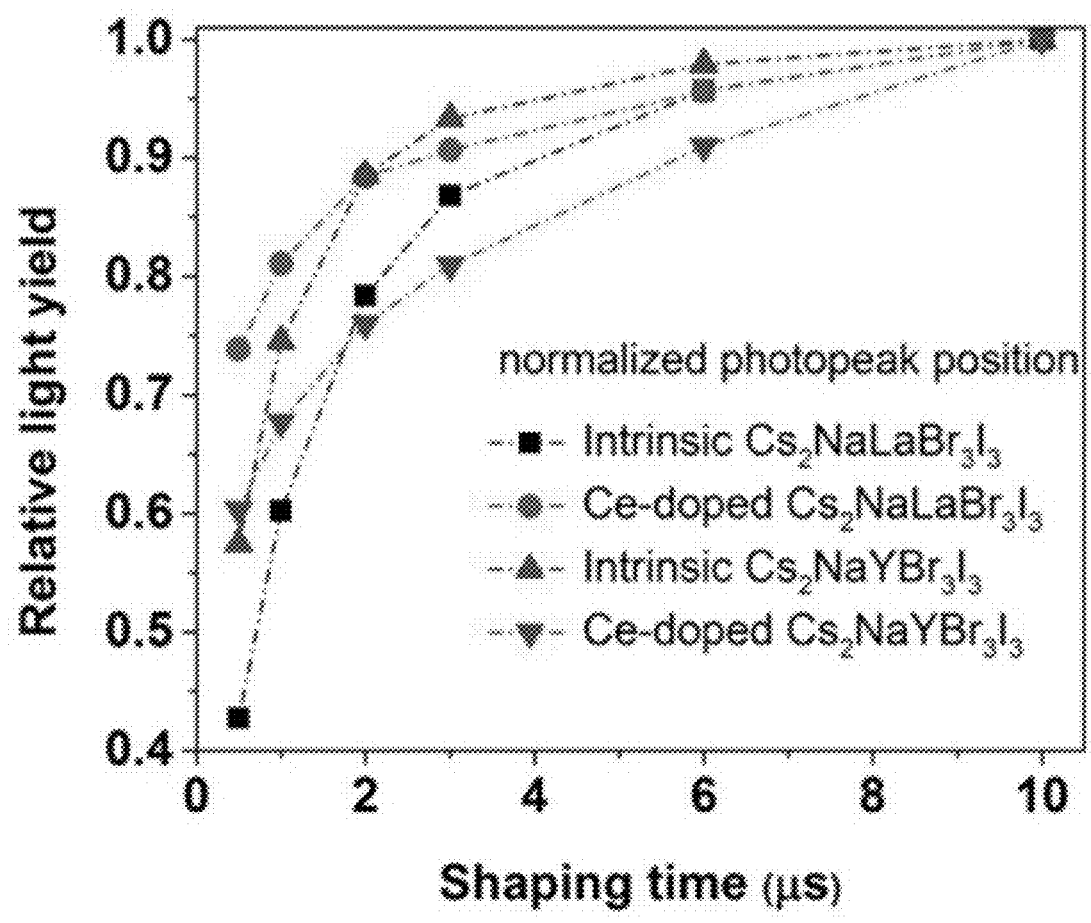
FIG. 14 illustrates the shaping time and relative light yield of exemplary $Cs_2NaLaBr_3I_3$:Ce and $Cs_2NaYBr_3I_3$:Ce scintillators and exemplary $Cs_2NaLaBr_3I_3$ and $Cs_2NaYBr_3I_3$ intrinsic scintillators.

The shaping time can affect the measured light yield value, as shown in FIG. 14. Compared with intrinsic samples, both extrinsic $Cs_2NaLaBr_3I_3$ and $Cs_2NaYBr_3I_3$ samples are less affected by reduced shaping time. When the shaping time is reduced below 3 us, the light yield of intrinsic samples drops tremendously. This indicates one or several slow decay components contribute to the light emission in the intrinsic samples, as reflected by the scintillation decay observations discussed previously.

Elapsolite Band Structure

Figure 15A:
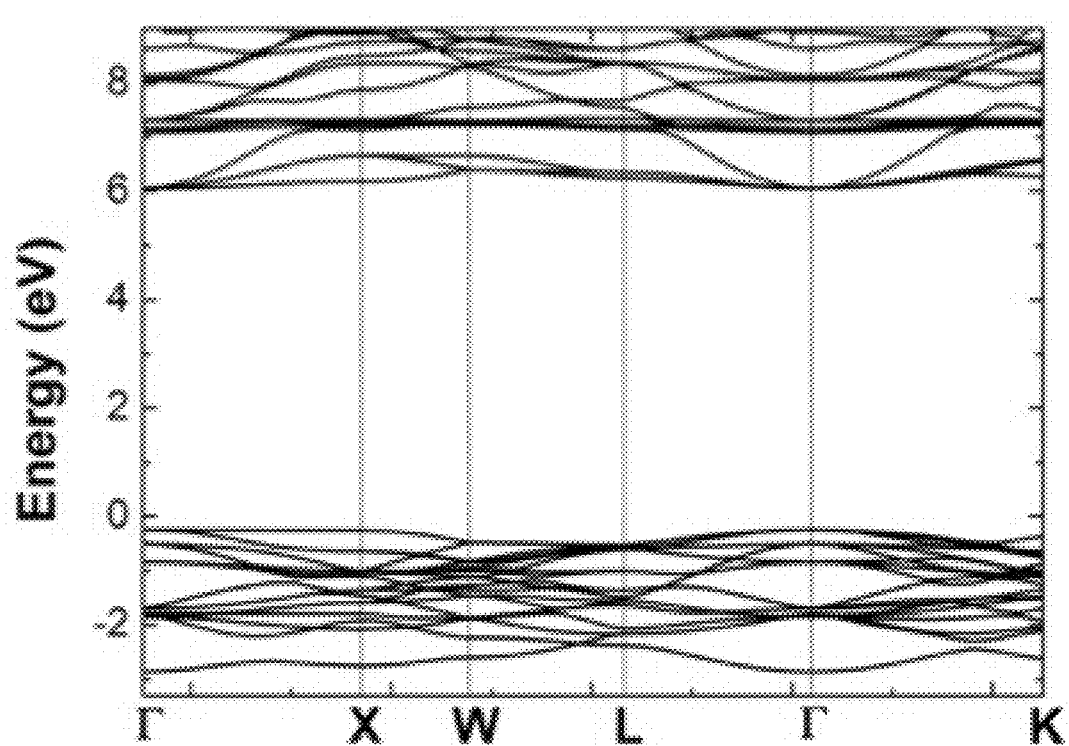
FIG. 15A illustrates the valence band structure of a scintillator containing atoms from one halide element, $Cs_2NaLaBr_6$.
Figure 15B:
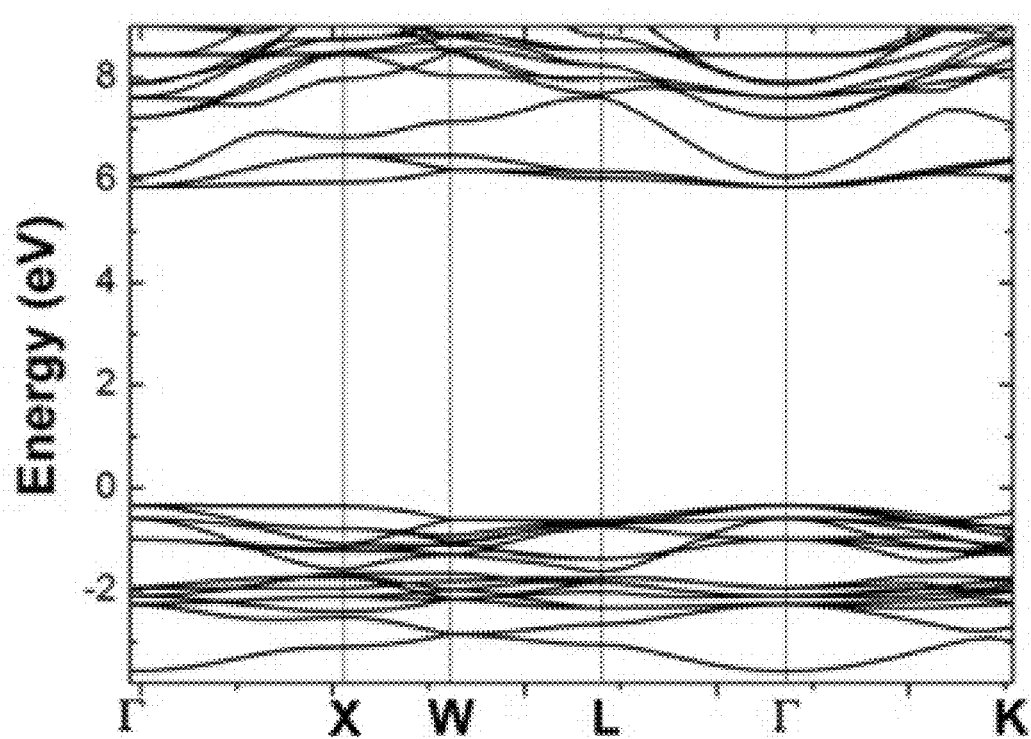
FIG. 15B illustrates the valence band structure of a scintillator containing atoms from one halide element, $Cs_2NaYBr_6$.
Figure 16:
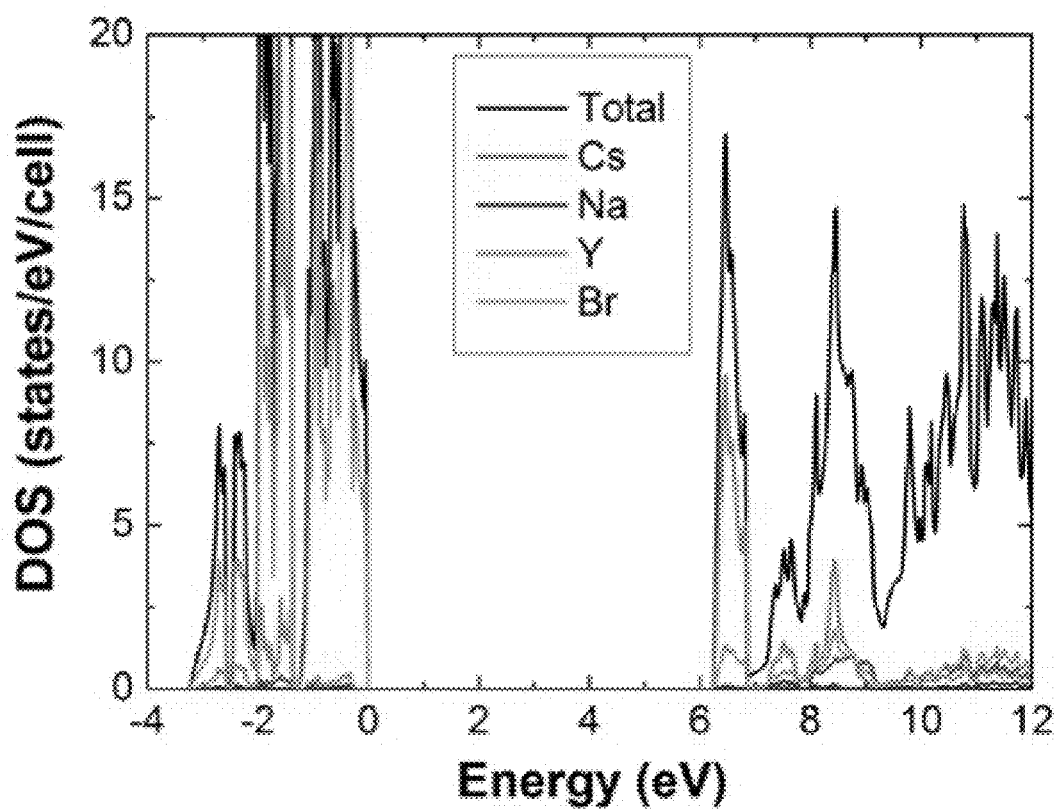
FIG. 16 illustrates the density states of a scintillator containing atoms from one halide element, $Cs_2NaYBr_6$.

The valence band of the exemplary rare-earth elpasolites studied here is made up of halogen p states while the conduction band is derived from the rare-earth d states. The band structures of $Cs_2NaLaBr_6$ and $Cs_2NaYBr_6$ are shown in FIGS. 15A and 15B, respectively, and the density states of $Cs_2NaYBr_6$ is shown in FIG. 16. Both valence and conduction bands are narrow, having small dispersion. Narrow valence bands are typical for halides, however, the narrow conduction band is unusual and is related to the structure and chemistry of elpasolites. In rare-earth elpasolites, such as $Cs_2NaYBr_6$, the rare-earth cation is much more electronegative than the alkali metal cations and, as a result, the conduction band is mainly a rare-earth d band, which is separated in energy from the alkali metal s band. The large nearest-neighbor distance between the rare-earth cations leads to weak coupling between the rare-earth d orbitals and consequently a very narrow conduction band as seen in FIGS. 15A, 15B, and 16.

The calculated band gaps of $Cs_2NaLaBr_6$ and $Cs_2NaYBr_6$ are 6.31 eV and 6.25 eV. Mixing bromides with iodides in 1:1 ratio reduces the band gaps to 5.41 eV and 5.15 eV for $Cs_2NaLaBr_3I_3$ and $Cs_2NaYBr_3I_3$, in agreement with experimentally measured band gaps of 4.92 eV and 4.87 eV, respectively. Pure iodides (i.e. $Cs_2NaLaI_6$ and $Cs_2NaYI_6$) have not been synthesized. The lattice constants of $Cs_2NaLaI_6$ and $Cs_2NaYI_6$ were optimized in cubic structures and the band gaps were calculated. The calculated band gaps of the hypothetical cubic $Cs_2NaLaI_6$ and $Cs_2NaYI_6$ are 5.02 eV and 4.93 eV, respectively. Thus, mixing bromides and iodides in 1:1 ratio reduces the band gaps of the alloys substantially from those of bromides to very close to those of iodides. The substantial reduction of the band gap by alloying leads to significant increase in light yield.

The narrow valence and conduction bands favor the self-trapping of both holes and electrons, forming small hole and electron polarons. The calculated binding energies of small hole and electron polarons and STEs in $Cs_2NaLaBr_6$ and $Cs_2NaYBr_6$ are shown in Table IV. In this table, the binding energy of a STE is calculated relative to the energies of small hole and electron polarons. The large binding energies presented in Table IV show that STEs are stable at room temperature and are likely to survive at even higher temperatures, and accordingly, STE emission should be observed at room temperature. The energy transfer in these elpasolites is due to hopping of localized STEs, not to the diffusion of free carriers. Therefore, the electron transfer is inefficient, which leads to relatively slow scintillation decay. Mixing bromides with iodides is expected to reduce the small hole binding energy and the STE binding energy, resulting in faster energy transfer.

TABLE IV

Calculated Binding Energies of Small Hole and Electron Polarons and Self-Trapped Excitons in $Cs_2NaLaBr_6$ and $Cs_2NaYBr_6$ Scintillators

| | Hole Polaron (eV) | Electron Polaron (eV) | STE (eV) |
|---|---|---|---|
| $Cs_2NaLaBr_6$ | 0.63 | 0.47 | 0.42 |
| $Cs_2NaYBr_6$ | 0.51 | 0.39 | 0.36 |

It may be appreciated that the disclosure may be not limited to the described embodiments, and that any number of scenarios and embodiments in which conflicting appointments exist may be resolved.

Although the disclosure has been described with reference to several exemplary embodiments, it may be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter may be to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be to be determined by the broadest permissible interpretation of the following claims and their equivalents, and shall not be restricted or limited by the foregoing detailed description.

What is claimed is:

1. A scintillator consisting essentially of an undoped chemical compound comprising atoms from two different halide elements.

2. The scintillator of claim 1, wherein the chemical compound has a chemical formula of $A_2BMX_{(6-y)}X'_y$ wherein $0<y<6$,
A is one of Li, Na, K, Rb, Cs, and Tl,
B is different from A and is one of Li, Na, K, Rb, and Cs,
M is one of La, Gd, Lu, Bi, Y,
X is one of F, Cl, Br, I, and
X' is different from X and is one of F, Cl, Br, and I.

3. The scintillator of claim 1, wherein the chemical compound has a chemical formula of $A_3MX_{(6-y)}X'_y$ wherein $0<y<6$,
A is one of Li, Na, K, Rb, Cs, and Tl,
M is one of La, Gd, Lu, Bi, Y,
X is one of F, Br, I, and
X' is different from X and is one of F, Br, and I.

4. The scintillator of claim 1, wherein the two different halide elements are F, Cl, Br, or I.

5. The scintillator of claim 1, wherein the chemical compound further comprises atoms from a trivalence element.

6. The scintillator of claim 1, wherein the chemical compound further comprises atoms from the group consisting of alkali elements and thallium.

7. A method of using an undoped chemical compound comprising atoms from two different halide elements as a scintillator.

8. The method of claim 7, wherein the chemical compound has a chemical formula of $$A_2BMX_{(6-y)}X'_y$$

wherein $0<y<6$,
A is one of Li, Na, K, Rb, Cs, and Tl,
B is different from A and is one of Li, Na, K, Rb, and Cs,
M is one of La, Gd, Lu, Bi, Y,
X is one of F, Cl, Br, I, and
X' is different from X and is one of F, Cl, Br, and I.

9. The method of claim 7, wherein the chemical compound has a chemical formula of $$A_3MX_{(6-y)}X'_y$$

wherein $0<y<6$,
A is one of Li, Na, K, Rb, Cs, and Tl,
M is one of La, Gd, Lu, Bi, Y,
X is one of F, Br, I, and
X' is different from X and is one of F, Br, and I.

10. The method of claim 7, wherein the two different halide elements are F, Cl, Br, or I.

11. The method of claim 7, wherein the chemical compound further comprises atoms from a trivalence element.

12. The method of claim 7, wherein the chemical compound further comprises atoms from the group consisting of alkali elements and thallium.

13. A method of preparing an undoped scintillator compound comprising atoms from two different halide elements, comprising the steps of:

mixing anhydrous starting materials;
loading the mixed starting materials into a quartz ampoule;
drying the mixed starting materials in the quartz ampoule under vacuum; and
melting the starting materials and synthesizing the scintillator compound using a single zone furnace,
wherein the orientation of the quartz ampoule is inverted a plurality of times.

14. The method of claim 13, wherein the scintillator compound has a chemical formula of $$A_2BMX_{(6-y)}X'_y$$

wherein $0<y<6$,
A is one of Li, Na, K, Rb, Cs, and Tl,
B is different from A and is one of Li, Na, K, Rb, and Cs,
M is one of La, Gd, Lu, Bi, Y,
X is one of F, Cl, Br, I, and
X' is different from X and is one of F, Cl, Br, and I.

15. The method of claim 13, wherein the scintillator compound has a chemical formula of $$A_3MX_{(6-y)}X'_y$$

wherein $0<y<6$,
A is one of Li, Na, K, Rb, Cs, and Tl,
M is one of La, Gd, Lu, Bi, Y,
X is one of F, Br, I, and
X' is different from X and is one of F, Br, and I.

* * * * *